(12) United States Patent
Harada et al.

(10) Patent No.: US 11,786,975 B2
(45) Date of Patent: Oct. 17, 2023

(54) CUTTING TOOL AND METHOD FOR MANUFACTURING THE SAME

(71) Applicant: Sumitomo Electric Industries, Ltd., Osaka (JP)

(72) Inventors: Haruko Harada, Osaka (JP); Satoshi Ono, Osaka (JP); Anongsack Paseuth, Osaka (JP); Katsumi Okamura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/794,989

(22) PCT Filed: Jan. 25, 2022

(86) PCT No.: PCT/JP2022/002579
§ 371 (c)(1),
(2) Date: Jul. 25, 2022

(65) Prior Publication Data
US 2023/0234141 A1 Jul. 27, 2023

(51) Int. Cl.
*B23B 27/14* (2006.01)
*C23C 16/36* (2006.01)
(Continued)

(52) U.S. Cl.
CPC ........... *B23B 27/148* (2013.01); *C23C 16/36* (2013.01); *C23C 16/45576* (2013.01); *C23C 16/56* (2013.01); *B23B 2228/105* (2013.01)

(58) Field of Classification Search
CPC . B32B 27/148; B32B 2228/105; C23C 16/36; C23C 16/56; C23C 16/45576
(Continued)

(56) References Cited

U.S. PATENT DOCUMENTS

| 10,654,181 B2* | 5/2020 | Yoshimura | .............. C23C 16/34 |
| 11,220,760 B2* | 1/2022 | Paseuth | ................. B23B 27/148 |

(Continued)

FOREIGN PATENT DOCUMENTS

| CN | 113529016 A | 10/2021 |
| JP | 2015-505902 A | 2/2015 |

(Continued)

OTHER PUBLICATIONS

Imamura et al., "Properties and cutting performance of AlTiCrN/TiSiCN bilayer coatings deposited by cathodic-arc ion plating", Surface & Coatings Technology, vol. 202, Jun. 2, 2007, pp. 820-825.

(Continued)

*Primary Examiner* — Michael M. Bernshteyn
(74) *Attorney, Agent, or Firm* — XSENSUS LLP

(57) ABSTRACT

A cutting tool includes a substrate and a coating film, wherein the coating film has a first layer formed from a plurality of hard grains, the hard grains are made of TiSiCN having a cubic crystal structure, the hard grains have a lamellar structure in which a layer having a relatively high silicon concentration and a layer having a relatively low silicon concentration are alternately stacked, and a maximum value of percentage of number $A_{Si}$ of silicon atoms to a sum of the number $A_{Si}$ of silicon atoms and number $A_{Ti}$ of titanium atoms in a grain boundary region between the hard grains, $\{A_{Si}/(A_{Si}+A_{Ti})\}\times 100$, is larger than an average value of percentage of number $B_{Si}$ of silicon atoms to a sum of the number $B_{Si}$ of silicon atoms and number $B_{Ti}$ of titanium atoms in the first layer, $\{B_{Si}/(B_{Si}+B_{Ti})\}\times 100$.

9 Claims, 11 Drawing Sheets

(51) Int. Cl.
  *C23C 16/56*  (2006.01)
  *C23C 16/455* (2006.01)
(58) Field of Classification Search
  USPC .......................................................... 428/698
  See application file for complete search history.

(56) References Cited

U.S. PATENT DOCUMENTS

| 2014/0370309 | A1* | 12/2014 | Endler | ................ C04B 41/4531 |
| | | | | 427/255.18 |
| 2018/0339415 | A1* | 11/2018 | Yoshimura | .............. B32B 15/04 |
| 2019/0071792 | A1* | 3/2019 | Paseuth | ................ C30B 25/165 |
| 2020/0232100 | A1* | 7/2020 | Endler | .................. C23C 28/044 |

FOREIGN PATENT DOCUMENTS

| JP | 2019-171547 A | 10/2019 |
| JP | 2020-507679 A | 3/2020 |

OTHER PUBLICATIONS

International Search Report and Written Opinion dated Mar. 8, 2022, received for PCT Application PCT/JP2022/002579, filed on Jan. 25, 2022, 12 pages including English Translation.

\* cited by examiner

CUTTING TOOL AND METHOD FOR MANUFACTURING THE SAME

CROSS-REFERENCE TO RELATED APPLICATION

The present application is based on PCT/JP2022/002579 filed on Jan. 25, 2022, the entire contents of which is incorporated herein by reference.

TECHNICAL FIELD

The present disclosure relates to a cutting tool and a method for manufacturing the same.

BACKGROUND ART

There has been conventionally developed a cutting tool in which a TiSiCN film is formed on a substrate for the purpose of an enhancement in wear resistance of the cutting tool.

PTL 1 discloses a nanocomposite coating film including a $TiC_xN_{1-x}$ nanocrystal layer manufactured by a thermal CVD method and a second phase of amorphous $SiC_xN_y$.

PTL 2 discloses at least one nanocomposite layer including a first nanocrystal phase made of cubic titanium oxycarbonitride manufactured by a thermal CVD method, and a second amorphous phase made of silicon oxycarbonitride or silicon oxycarbide.

NPL 1 discloses a TiSiCN coating film having a nanocomposite structure formed by a PVD method.

CITATION LIST

Patent Literature

PTL 1: Japanese National Patent Publication No. 2015-505902
PTL 2: Japanese National Patent Publication No. 2020-507679

Non Patent Literature

NPL 1: Shinya Imamura et al., "Properties and cutting performance of AlTiCrN/TiSiCN bilayer coatings deposited by cathodic-arc ion plating", Surface and Coatings Technology, 202, (2007), 820-825

SUMMARY OF INVENTION

The present disclosure is a cutting tool comprising a substrate and a coating film disposed on the substrate, wherein
the coating film comprises a first layer formed from a plurality of hard grains,
the hard grains are made of TiSiCN having a cubic crystal structure,
the hard grains have a lamellar structure in which a layer having a relatively high silicon concentration and a layer having a relatively low silicon concentration are alternately stacked, and
a maximum value of percentage of number $A_{Si}$ of silicon atoms to a sum of the number $A_{Si}$ of silicon atoms and number $A_{Ti}$ of titanium atoms in a grain boundary region between the hard grains, $\{A_{Si}/(A_{Si}+A_{Ti})\} \times 100$, is larger than an average value of percentage of number $B_{Si}$ of silicon atoms to a sum of the number $B_{Si}$ of silicon atoms and number $B_{Ti}$ of titanium atoms in the first layer, $\{B_{Si}/(B_{Si}+B_{Ti})\} \times 100$.

The present disclosure is a method for manufacturing the above cutting tool, the method comprising
step 1 of providing a substrate,
step 2 of forming a coating film on the substrate, and
step 3 of subjecting the coating film to a heat treatment to obtain a cutting tool, wherein
the coating film formed in step 2 comprises a first layer formed from a plurality of hard grains,
the hard grains are made of TiSiCN having a cubic crystal structure, and
the hard grains have a lamellar structure in which a layer having a relatively high silicon concentration and a layer having a relatively low silicon concentration are alternately stacked.

DETAILED DESCRIPTION

Figure 1:
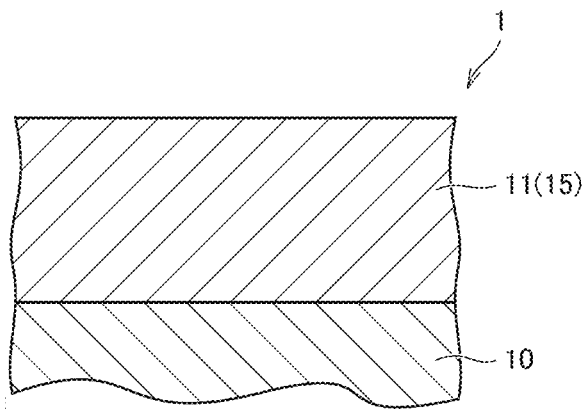
FIG. 1 is a schematic view illustrating one example of a cross section of a cutting tool according to embodiment 1.

Problem to be Solved by the Present Disclosure

An enhancement in tool life has been recently increasingly demanded, and, in particular, a further enhancement in tool life has been demanded in general high-efficiency processing.

An object is to provide a cutting tool that can have a long tool life in general high-efficiency processing.

Advantageous Effect of the Present Disclosure

According to the present disclosure, it is possible to provide a cutting tool that can have a long tool life in general high-efficiency processing.

DESCRIPTION OF EMBODIMENTS

First, aspects of the present disclosure are listed and described.

(1) The present disclosure is a cutting tool comprising a substrate and a coating film disposed on the substrate, wherein the coating film comprises a first layer formed from a plurality of hard grains, the hard grains are made of TiSiCN having a cubic crystal structure, the hard grains have a lamellar structure in which a layer having a relatively high silicon concentration and a layer having a relatively low silicon concentration are alternately stacked, and a maximum value of percentage of number $A_{Si}$ of silicon atoms to a sum of the number $A_{Si}$ of silicon atoms and number $A_{Ti}$ of titanium atoms in a grain boundary region between the hard grains, $\{A_{Si}/(A_{Si}+A_{Ti})\} \times 100$, is larger than an average value of percentage of number $B_{Si}$ of silicon atoms to a sum of the number $B_{Si}$ of silicon atoms and number $B_{Ti}$ of titanium atoms in the first layer, $\{B_{Si}/(B_{Si}+B_{Ti})\} \times 100$.

According to the present disclosure, it is possible to provide a cutting tool that can have a long tool life in general high-efficiency processing.

(2) A difference between the maximum value of percentage $\{A_{Si}/(A_{Si}+A_{Ti})\} \times 100$ and the average value of percentage $\{B_{Si}/(B_{Si}+B_{Ti})\} \times 100$ is preferably 0.5% or more. This leads to a further enhancement in tool life.

(3) The average value of percentage $\{B_{Si}/(B_{Si}+B_{Ti})\} \times 100$ is preferably 0.5% or more and 10% or less. This leads to a further enhancement in tool life.

(4) Preferably, the first layer has a thickness of 3 μm or more and 15 μm or less and the coating film has a thickness of 3 μm or more and 30 μm or less. This leads to a further enhancement in tool life.

(5) Preferably, the maximum value of percentage $\{A_{Si}/(A_{Si}+A_{Ti})\} \times 100$ is measured by subjecting the grain boundary region in a cross section along a normal line of a surface of the coating film, to line analysis at a length of 60 nm or more in a direction perpendicular to an extension direction of the grain boundary region, by use of STEM-EDX, and the average value of percentage $\{B_{Si}/(B_{Si}+B_{Ti})\} \times 100$ is measured by subjecting a rectangular measurement field of view of 100 nm×100 nm provided in the first layer in the cross section, to rectangular analysis by use of STEM-EDX. According to this, the accuracies of measurement results are favorable.

(6) The hard grains preferably have an average aspect ratio of 2 or more. This leads to a further enhancement in tool life.

(7) The present disclosure is a method for manufacturing the cutting tool, comprising step 1 of providing a substrate, step 2 of forming a coating film on the substrate, and step 3 of subjecting the coating film to a heat treatment to obtain a cutting tool, wherein the coating film formed in step 2 comprises a first layer formed from a plurality of hard grains, the hard grains are made of TiSiCN having a cubic crystal structure, and the hard grains have a lamellar structure in which a layer having a relatively high silicon concentration and a layer having a relatively low silicon concentration are alternately stacked.

According to the present disclosure, it is possible to provide a cutting tool that can have a long tool life in general high-efficiency processing.

(8) The heat treatment in step 3 preferably comprises heating the coating film at 1050° C. or more and 1100° C. or less in a hydrogen atmosphere at a pressure of 850 hPa or more and 950 hPa or less for 5 minutes or more and 30 minutes or less. According to this, transfer of silicon in the hard grains toward the grain boundary region is promoted.

(9) Preferably, step 2 comprises step 2a of forming the first layer by a CVD method with a CVD apparatus, step 2a comprises step 2a-1 of spraying a $TiCl_4$ gas, a $SiCl_4$ gas and a $CH_3CN$ gas toward a surface of the substrate, the $TiCl_4$ gas is sprayed through a plurality of first spray holes provided on a nozzle of the CVD apparatus, the $SiCl_4$ gas is sprayed through a plurality of second spray holes provided on the nozzle, the $CH_3CN$ gas is sprayed through a plurality of third spray holes provided on the nozzle, the nozzle is rotated in step 2a-1, the plurality of second spray holes include a second-first spray hole and a second-second spray hole, and a diameter r1 of the second-first spray hole is different from a diameter r2 of the second-second spray hole.

According to this, formation of a lamellar structure of the hard grains is promoted.

Details of the Embodiments of the Present Disclosure

Specific examples of the cutting tool of the present disclosure and a method for manufacturing the same will be hereinafter described with reference to the drawings. The same reference symbols in the drawings in the present disclosure represent the same or corresponding portions. The dimensional relationships of length, width, thickness, depth, and the like are appropriately modified for clarity and simplicity of the drawings, and do not necessarily represent the actual dimensional relationships.

In the present specification, the designation of form "A to B" herein means the upper limit and the lower limit of a range (namely, A or more and B or less), and when no unit is designated with A and any unit is designated only with B, the unit of A and the unit of B are the same.

In the present specification, when a compound or the like is represented by a chemical formula, the atomic ratio encompasses any atomic ratio conventionally known, if not particularly limited, and should not be necessarily limited to be only in any stoichiometric range. For example, when "TiSiCN" is described, the ratio of the numbers of atoms constituting TiSiCN encompasses any atomic ratio conventionally known.

Embodiment 1: Cutting Tool

A cutting tool of one embodiment of the present disclosure (hereinafter, also designated as "the present embodiment".) is a cutting tool including a substrate and a coating film disposed on the substrate, the coating film comprises a first layer formed from a plurality of hard grains, the hard grains are made of TiSiCN having a cubic crystal structure, the hard grains have a lamellar structure in which a layer having a relatively high silicon concentration and a layer having a relatively low silicon concentration are alternately stacked, and the maximum value of percentage of number $A_{Si}$ of silicon atoms to the sum of number $A_{Si}$ of silicon atoms and number $A_{Ti}$ of titanium atoms in a grain boundary region between the hard grains, $\{A_{Si}/(A_{Si}+A_{Ti})\} \times 100$, is larger than the average value of percentage of number $B_{Si}$ of silicon atoms to the sum of number $B_{Si}$ of silicon atoms and number $B_{Ti}$ of titanium atoms in the first layer, $\{B_{Si}/(B_{Si}+B_{Ti})\} \times 100$.

The cutting tool of the present embodiment can have a long tool life in general high-efficiency processing. The reason for this, while not clear, is presumed as described in the following (i) to (v).

(i) The coating film in the cutting tool of the present embodiment comprises a first layer formed from hard grains. The hard grains are made of TiSiCN, and thus the first layer can have a region that is formed from a columnar crystal extending in the thickness direction (hereinafter, also designated as "columnar structure".). Thus, the first layer is enhanced in toughness, and thermal cracks due to cutting, even if occur in the surface of the coating film, are effectively inhibited from progressing to the substrate. Furthermore, the first layer has a columnar structure to thereby allow the crack progress direction to have anisotropy, and thus the coating film is enhanced in peeling resistance. Therefore, the cutting tool can have a long tool life.

(ii) The hard grains in the cutting tool of the present embodiment are made of TiSiCN having a cubic crystal structure. The hard grains have high hardness The first layer formed from the hard grains has high hardness and has excellent wear resistance. Therefore, the cutting tool can have a long tool life.

(iii) The hard grains in the cutting tool of the present embodiment have a lamellar structure in which a layer having a relatively high silicon concentration and a layer having a relatively low silicon concentration are alternately stacked. According to this, a strain occurs in the hard grains, and cracks due to cutting, even if occur in the surface of the coating film, are effectively inhibited from progressing to the substrate. The hard grains and the first layer have higher hardness, and the cutting tool is enhanced in wear resistance. Therefore, the cutting tool can have a long tool life.

(iv) The maximum value (hereinafter, also designated as "the maximum value of the silicon content in the grain boundary region".) of percentage $\{A_{Si}/(A_{Si}+A_{Ti})\} \times 100$ of number $A_{Si}$ of silicon atoms to the sum of number $A_{Si}$ of silicon atoms and number $A_{Ti}$ of titanium atoms in the grain boundary region between the hard grains in the first layer of the cutting tool of the present embodiment is larger than the average value (hereinafter, also designated as "the average value of the silicon content in the first layer".) of percentage $\{B_{Si}/(B_{Si}+B_{Ti})\} \times 100$ of number $B_{Si}$ of silicon atoms to the sum of number $B_{Si}$ of silicon atoms and number $B_{Ti}$ of titanium atoms in the first layer. In other words, the maximum value of the silicon content in the grain boundary region between the hard grains is larger than the average value of the silicon content in the first layer. According to this, a silicon concentration gradient is generated in the vicinity of the grain boundary between the hard grains, and the lattice constant in the vicinity of the grain boundary is accordingly changed to lead to the occurrence of strain. The strain suppresses crack propagation. Therefore, the cutting tool can have along tool life.

(v) The maximum value of the silicon content in the grain boundary region between the hard grains in the first layer of the cutting tool of the present embodiment is larger than the average value of the silicon content in the first layer. Silicon present in the grain boundary region is bound to oxygen penetrating into the coating film along with the grain boundary in high-efficiency processing of a workpiece material. Thus, oxidation of the hard grains and/or the substrate is suppressed. Therefore, the cutting tool can have a long tool life.

<Cutting Tool>

As illustrated in FIG. 1, a cutting tool 1 of the present embodiment includes a substrate 10, and a coating film 15 disposed on substrate 10. FIG. 1 illustrates a case where coating film 15 is configured from only a first layer 11. A portion involving cutting of the substrate is preferably at least partially coated with coating film 15, and the entire surface of the substrate is further preferably coated with the coating film. The portion involving cutting of the substrate means a region within a distance from a blade edge line in the surface of the substrate, of 500 μm. Even in a case where a portion of the substrate is not coated with the coating film or the configuration of the coating film is partially different, such a case does not depart from the scope of the present disclosure.

<Type of Cutting Tool>

The cutting tool of the present disclosure can be, for example, a drill, an end mill (for example, ball-end mill), a blade edge-exchangeable cutting tip for drills, a blade edge-exchangeable cutting tip for end mills, a blade edge-exchangeable cutting tip for milling, a blade edge-exchangeable cutting tip for turning, a metal saw, a gear cutting tool, a reamer, or a tap.

<Substrate>

Substrate 10 includes a rake face and a flank face, and this substrate here used can be any conventionally known substrate. For example, any of cemented carbide (for example, WC-based cemented carbide including tungsten carbide and cobalt, the cemented carbide can include carbonitride of, for example Ti, Ta, or Nb), cermet (mainly including, for example, TiC, TiN, or TiCN), high-speed steel, ceramics (for example, titanium carbide, silicon carbide, silicon nitride, aluminum nitride, and aluminum oxide), a cubic boron nitride sintered body, or a diamond sintered body is preferable.

Among these various substrates, a substrate is preferable which is made of cemented carbide including tungsten carbide and cobalt and in which the cobalt content in the cemented carbide is 6% by mass or more and 11% by mass or less. According to this, the substrate is excellent in balance between hardness and strength at a high temperature, and has excellent characteristics as a substrate of a cutting tool for the above applications. When WC-based cemented carbide is used in the substrate, the structure thereof may include free carbon, and an abnormal layer called η phase or ε phase.

Furthermore, the surface of the substrate may be modified. For example, in the case of cemented carbide, a β-free layer may be formed on the surface, and in the case of cermet, a surface-cured layer may be formed. The substrate exerts a desired effect even if the surface thereof is modified.

When the cutting tool is, for example, a blade edge-exchangeable cutting tip, the substrate may optionally have a tip breaker. The shape of the blade edge line portion may be, for example, any of a sharp edge (a ridge in which a rake face and a flank face cross each other), honing (formed so that a sharp edge has a curve (R)), a negative land (formed by leveling), or a combination of honing and a negative land.

<Coating Film>
<<Configuration of Coating Film>>

The coating film in the present embodiment comprises a first layer formed from a plurality of hard grains. The coating film in the present embodiment may include any other layer as long as it comprises the first layer.

Figure 2:
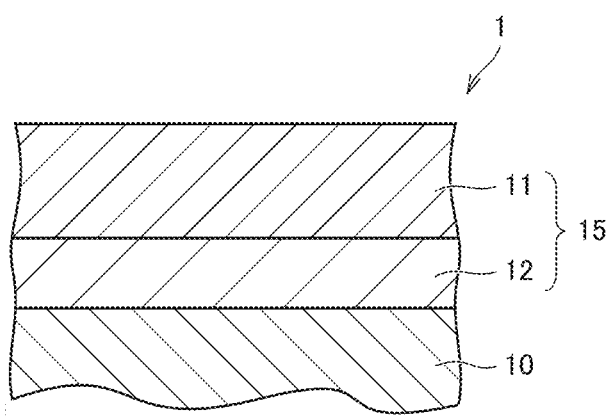
FIG. 2 is a schematic view illustrating another example of the cross section of the cutting tool according to embodiment 1.

For example, as illustrated in cutting tool 1 in FIG. 2, coating film 15 can include, in addition to first layer 11, a foundation layer 12 disposed between substrate 10 and first layer 11.

Figure 3:
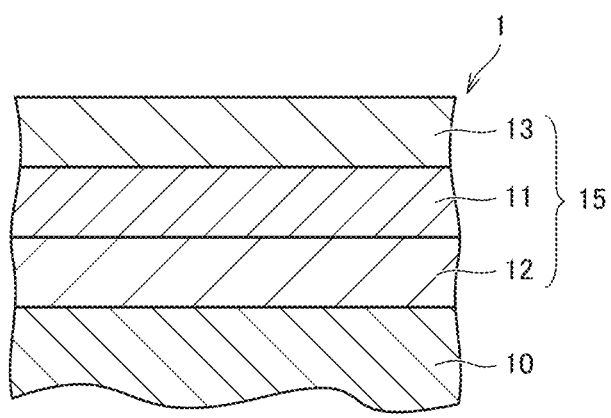
FIG. 3 is a schematic view illustrating another example of the cross section of the cutting tool according to embodiment 1.

As illustrated in cutting tool 1 in FIG. 3, coating film 15 can include, in addition to first layer 11 and foundation layer 12, a surface layer 13 disposed on first layer 11.

Figure 4:
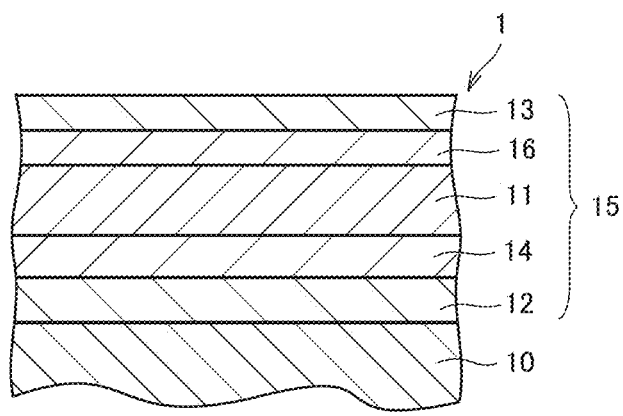
FIG. 4 is a schematic view illustrating another example of the cross section of the cutting tool according to embodiment 1.

As illustrated in cutting tool 1 in FIG. 4, coating film 15 can include, in addition to first layer 11, foundation layer 12 and surface layer 13, a first intermediate layer 14 disposed between foundation layer 12 and first layer 11. Coating film 15 can also have a second intermediate layer 16 disposed between first layer 11 and surface layer 13.

The details of the first layer, the foundation layer, the first intermediate layer, the second intermediate layer and the surface layer will be described below.

<<Thickness of Coating Film>>

The thickness of the coating film in the present embodiment is preferably 3 μm or more and 30 μm or less. The thickness of the coating film here means the thickness of the entire coating film. If the thickness of the entire coating film is 3 μm or more, excellent wear resistance can be achieved. On the other hand, if the thickness of the entire coating film is 30 μm or less, the occurrence of peeling or breaking of the coating film in application of large stress between the coating film and the substrate during cutting processing can be suppressed. The lower limit of the thickness of the entire coating film is more preferably 5 μm or more, further preferably 10 μm or more, from the viewpoint of an enhancement in wear resistance. The upper limit of the thickness of the entire coating film is more preferably 25 μm or less, further preferably 20 μm or less, from the viewpoint of suppression of the occurrence of peeling or breaking of the coating film. The thickness of the entire coating film is more preferably 5 μm or more and 25 μm or less, further preferably 10 μm or more and 20 μm or less.

The above thickness of the coating film is measured by obtaining a sample of a cross section in parallel with a normal line direction of the surface of the coating film and observing the sample with a scanning transmission electron microscopy (STEM). Examples of the scanning transmission electron microscopy include JEM-2100F (trademark) manufactured by JEOL Ltd.

In the present specification, the "thickness" means an average thickness Specifically, the observation magnification of the sample of the cross section is 10000×, a rectangular measurement field of view of (100 μm in a direction in parallel with the substrate surface)×(the distance including the thickness of the entire coating film) is set in an electron microscopic image, the thicknesses are measured at 10 points in the field of view, and the average value is defined as the "thickness". The thickness (average thickness) of each layer described below is also measured and calculated in the same manner.

It has been confirmed that, as long as measurement is performed in the same sample, measurement results are obtained with almost no variation and there is no arbitrariness even with a measurement field of view arbitrarily set, even if a location selected in a measurement field of view is changed and such measurement is performed multiple times.

<First Layer>
<<Configuration of First Layer>>

Figure 5:
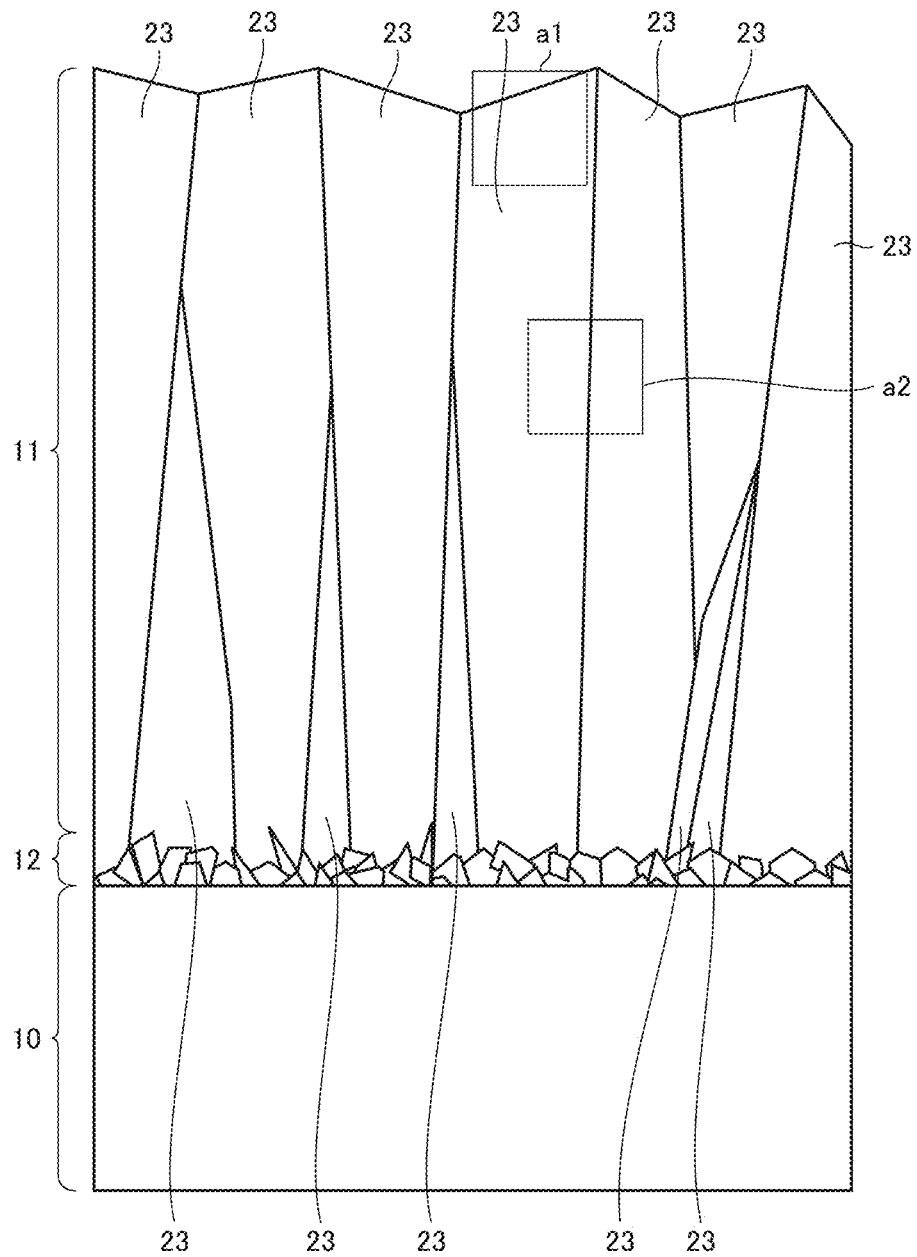
FIG. 5 is a view schematically illustrating another example of the cross section of the cutting tool according to embodiment 1.
Figure 6:
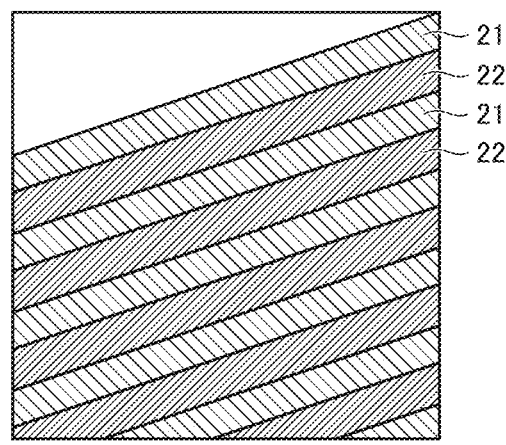
FIG. 6 is an enlarged view of a rectangular section surrounded by a frame border indicated by a symbol a1 in FIG. 5.
Figure 7:
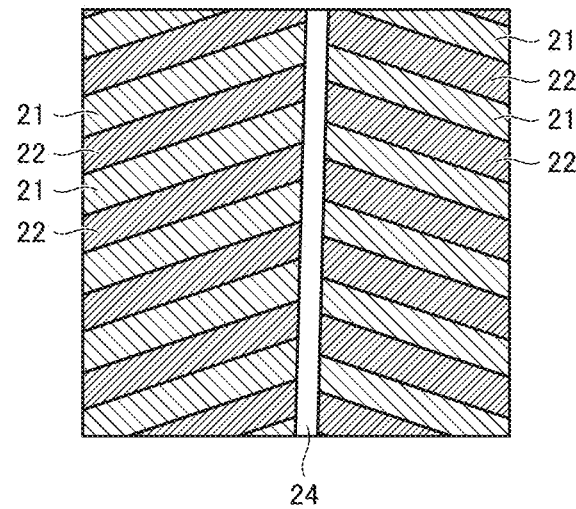
FIG. 7 is an enlarged view of a rectangular section surrounded by a frame border indicated by a symbol a2 in FIG. 5.

The configuration of the first layer is described with reference to FIGS. 5 to 7. FIG. 5 is a view schematically illustrating another example of the cross section of the cutting tool according to embodiment 1. FIG. 6 is an enlarged view of a rectangular section surrounded by a frame border indicated by symbol a1 in FIG. 5. FIG. 7 is an enlarged view of a rectangular section surrounded by a frame border indicated by symbol a2 in FIG. 5. As illustrated in FIG. 5, first layer 11 in the present embodiment is formed from a plurality of hard grains 23. As illustrated in FIGS. 6 and 7, the hard grains are made of TiSiCN having a cubic crystal structure, and have a lamellar structure in which a layer having a relatively high silicon concentration 22 and a layer having a relatively low silicon concentration 21 are alternately stacked.

The first layer in the present embodiment, even when includes, as inevitable impurities, any component(s) other than the hard grains, for example, an amorphous phase and/or an intermetallic compound (for example, $TiSi_2$ or $Co_2Si$), does not depart from the scope of the present disclosure as long as the effects of the present disclosure are exerted.

<<Thickness of First Layer>>

The thickness of the first layer in the present embodiment is preferably 3 μm or more and 15 μm or less. If the thickness of the first layer is 3 μm or more, excellent wear resistance and oxidation resistance can be achieved. On the other hand, if the thickness of the first layer is 15 μm or less, the occurrence of peeling or breaking of the coating film in application of large stress between the coating film and the substrate during cutting processing can be suppressed. The lower limit of the thickness of the first layer is preferably 3 μm or more, 4 μm or more, 5 μm or more, from the viewpoint of enhancements in wear resistance and oxidation resistance. The upper limit of the thickness of the first layer is preferably 15 μm or less, 10 μm or less, from the viewpoint of suppression of the occurrence of peeling or breaking of the coating film. The thickness of the first layer is preferably 3 μm or more and 15 μm or less, 4 μm or more and 15 μm or less, 5 μm or more and 15 μm or less, 3 μm or more and 10 μm or less, 4 μm or more and 10 μm or less, 5 μm or more and 10 μm or less.

<<Composition of Hard Grains>>

In the present embodiment, the hard grains are made of TiSiCN having a cubic crystal structure (hereinafter, also designated as "cubic structure".). The hard grains, when have a cubic structure, can have not only excellent wear resistance, but also simultaneously have high toughness. The composition of the hard grains can be confirmed by EDX (energy dispersive X-ray spectroscopy). The hard grains having a cubic structure can be confirmed by pattern analysis of electron diffraction by a restricted field of view. As illustrated in FIG. 5, the hard grains made of TiSiCN are columnar crystals extending in the thickness direction of the first layer.

The hard grains, even when include inevitable impurities other than TiSiCN, do not depart from the scope of the present disclosure as long as the effects of the present disclosure are exerted.

<<Lamellar Structure>> in the present embodiment, the hard grains have a lamellar structure in which a layer having a relatively high silicon concentration and a layer having a relatively low silicon concentration are alternately stacked. Hereinafter, the layer having a relatively high silicon concentration is also designated as "silicon high-concentration layer", and the layer having a relatively low silicon concentration is also designated as "silicon low-concentration layer". The hard grains having the lamellar structure in which the layer having a relatively high silicon concentration and the layer having a relatively low silicon concentration are alternately stacked are confirmed by the following methods (A1) to (A6).

(A1) The cutting tool is cut by a diamond wire along with a normal line of the surface of the coating film, and a cross section of the first layer is thus exposed. The cross section exposed is subjected to focusing ion beam processing (hereinafter, also designated as "FIB processing".), and the cross section is thus in a mirror state.

Figure 8:
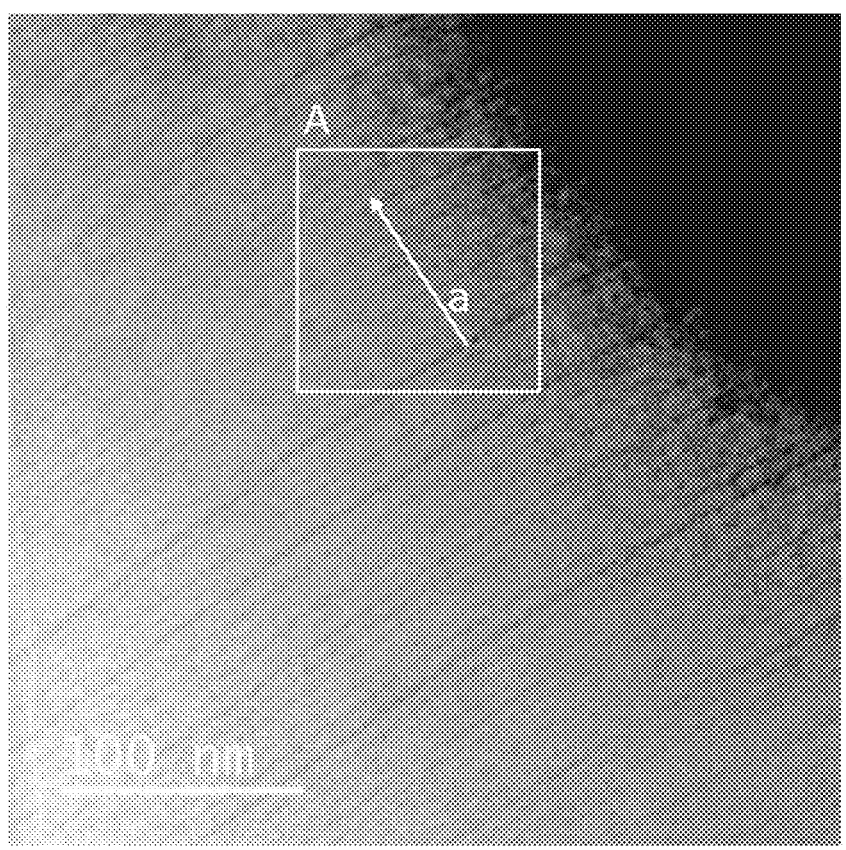
FIG. 8 is a view illustrating one example of a high angle annular dark field scanning transmission electron microscopy (HAADF-STEM) image of a cross section of a first layer in the cutting tool according to embodiment 1.

(A2) The cross section subjected to FIB processing is observed with a high angle annular dark field scanning transmission electron microscopy (HAADF-STEM), and one of the hard grains is specified. The observation magnification is 500,000×. Next, a HAADF-STEM image of such one of the hard grains specified is obtained. FIG. 8 is a view illustrating one example of a HAADF-STEM image of one of the hard grains in the cutting tool of the present embodiment. In FIG. 8, a layer indicated by black is a region having a relatively high silicon concentration (silicon high-concentration layer) and a layer indicated by white or gray is a region having a relatively low silicon concentration (silicon low-concentration layer).

(A3) A measurement region (size: 100 nm×100 nm) in the HAADF-STEM image is set so as to include a region in which the silicon high-concentration layer indicated by black and the silicon low-concentration layer indicated by white or gray are each stacked in ten or more layers. In FIG. 8, a square region (hereinafter, also designated as "region A".) surrounded by a white frame border indicated by a symbol A corresponds to the measurement region.

Figure 9:
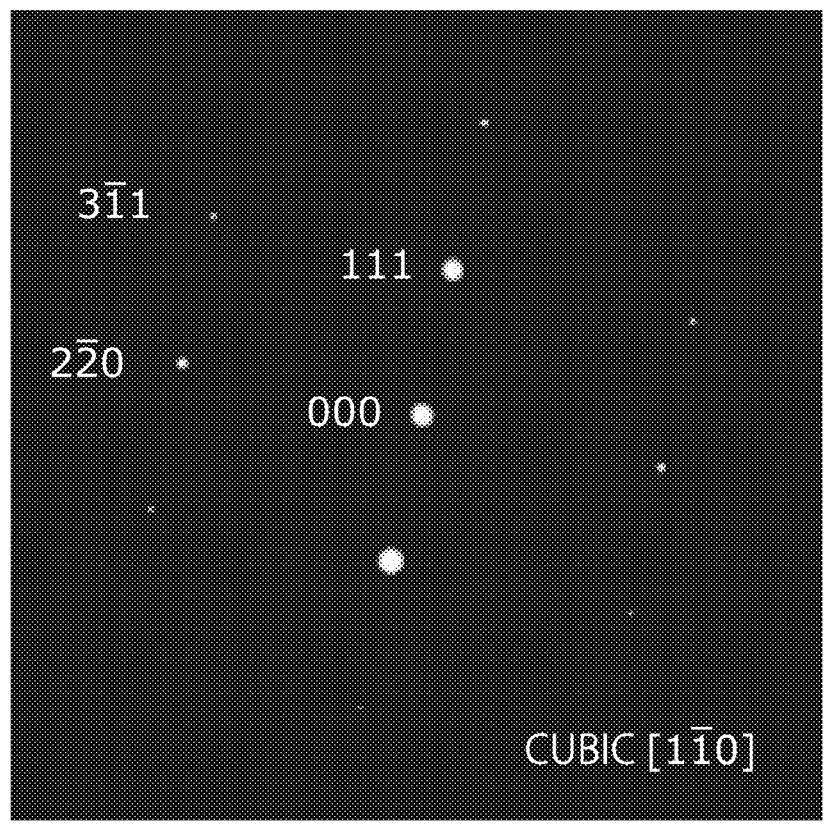
FIG. 9 is an electron diffraction image taken in a region A illustrated in FIG. 8.

(A4) The stacking direction of the silicon high-concentration layer and the silicon low-concentration layer is specified in the measurement region in the above HAADF-STEM image. Specifically, an electron diffraction pattern in a region of a restricted field of view are overlapped with a stacking orientation of the silicon high-concentration layer and the silicon low-concentration layer, and the stacking orientation is specified by an orientation indicated by a diffraction spot. FIG. 9 illustrates an electron diffraction image taken in region A illustrated in FIG. 8. The stacking direction specified based on the electron diffraction image is indicated by a white arrow in FIG. 8.

(A5) Line analysis is performed with EDX attached to STEM along with the stacking direction in the measurement region in the above HAADF-STEM image, and the composition is determined. The beam diameter in line analysis is 0.5 nm or less, the scan interval is 0.5 nm, and the length in line analysis is 50 nm.

(A6) When the results of line analysis satisfy the following (a1) to (a2), the hard grains are confirmed to have a lamellar structure in which the layer having a relatively high silicon concentration and the layer having a relatively low silicon concentration are alternately stacked.

(a1) The measurement region includes titanium (Ti), silicon (Si), carbon (C) and nitrogen (N).

(a2) A graph is created in which the results of line analysis are represented in a system of coordinates where the X-axis represents a distance from a measurement start point and the Y-axis represents percentage $\{X_{Si}/(X_{Si}+X_{Ti})\} \times 100$ of number $X_{Si}$ of silicon atoms to the sum of number $X_{Si}$ of silicon atoms and number $X_{Ti}$ of titanium atoms. The average of percentage $\{X_{Si}/(X_{Si}+X_{Ti})\} \times 100$ in the measurement region (hereinafter, also designated as "average".) is calculated in the graph. An increase in distance from a measurement start point allows for alternating presence of regions that are respectively larger and smaller in percentage $\{X_{Si}/(X_{Si}+X_{Ti})\} \times 100$ than the average value. The region in which percentage $\{X_{Si}/(X_{Si}+X_{Ti})\} \times 100$ is larger than the average value corresponds to the layer having a relatively high silicon concentration. The region in which percentage $\{X_{Si}/(X_{Si}+X_{Ti})\} \times 100$ is smaller than the average value corresponds to the layer having a relatively low silicon concentration.

Figure 10:
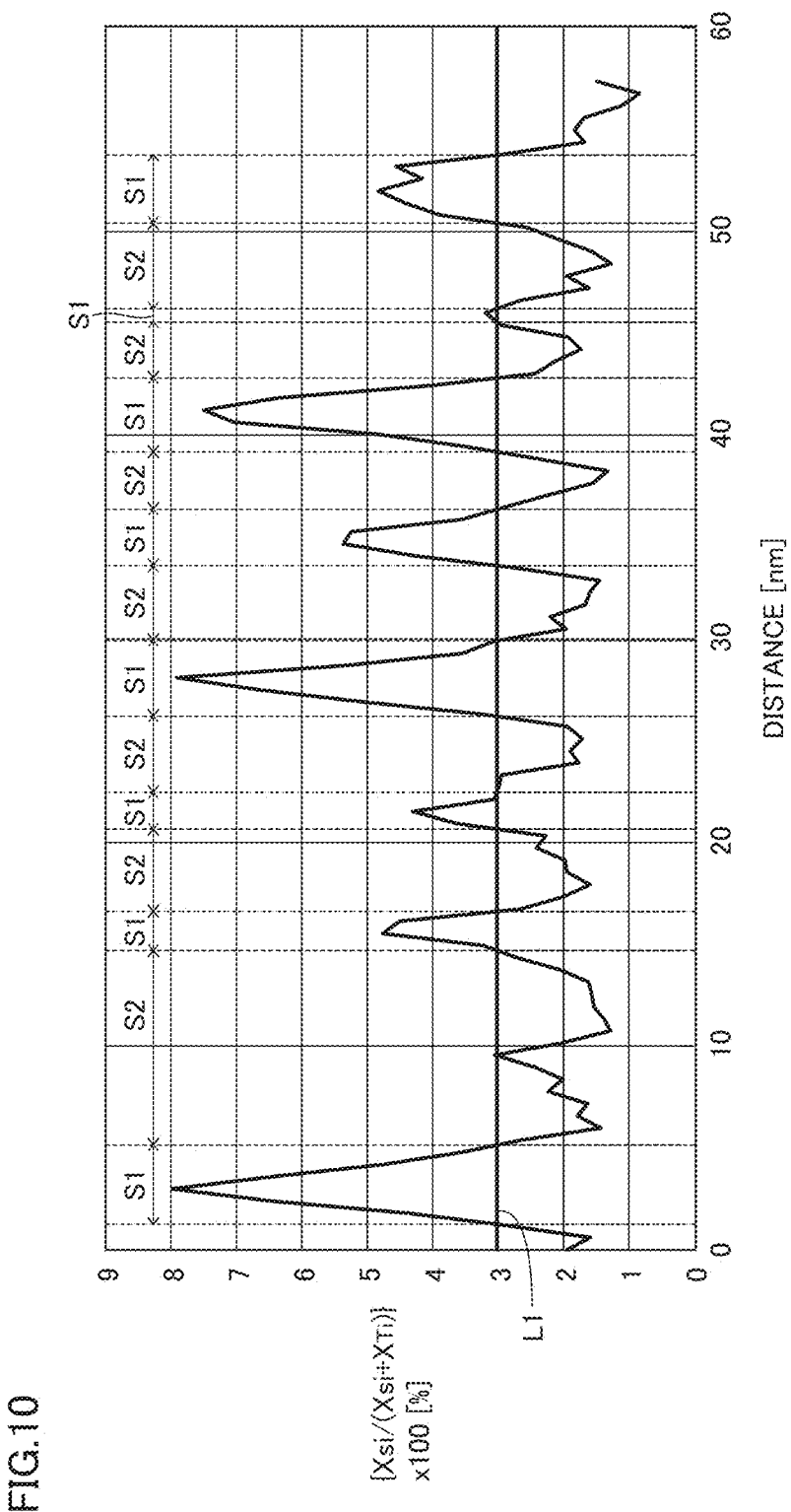
FIG. 10 is a graph representing the results of line analysis along with an arrow direction indicated in FIG. 8.

FIG. 10 illustrates one example of the graph in the present embodiment. In FIG. 10, the X-axis represents a distance along with the stacking direction, from a measurement start point, and the Y-axis represents percentage $\{X_{Si}/(X_{Si}+X_{Ti})\} \times 100$ of number $X_{Si}$ of silicon atoms to the sum of number $X_{Si}$ of silicon atoms and number $X_{Ti}$ of titanium atoms. In FIG. 10, the average of percentage $\{X_{Si}/(X_{Si}+X_{Ti})\} \times 100$ in the measurement region is indicated by a slid line L1.

In FIG. 10, an increase in distance from a measurement start point allows for alternating presence of a region S1 and a region S2 that are respectively larger and smaller in percentage $\{X_{Si}/(X_{Si}+X_{Ti})\} \times 100$ than the above average value. Accordingly, the hard grains illustrated in FIG. 8 are confirmed to have a lamellar structure in which the layer having a relatively high silicon concentration and the layer having a relatively low silicon concentration are alternately stacked.

It has been confirmed that, as long as measurement is performed in the same sample, measurement results are obtained with almost no variation and there is no arbitrariness even with a measurement point arbitrarily set, even if the hard grain specified in (A2) above is changed and such measurement is performed multiple times.

<<Compositions of Silicon High-Concentration Layer and Silicon Low-Concentration Layer>>

Percentage $\{X_{Si}/(X_{Si}+X_{Ti})\} \times 100$ of number $X_{Si}$ of silicon atoms to the sum of number $X_{Si}$ of silicon atoms and number $X_{Ti}$ of titanium atoms in each of the silicon high-concentration layer and the silicon low-concentration layer is preferably 0.1% or more and 10% or less. According to this, thermal crack resistance of the first layer and adhesiveness of the first layer to a layer adjacent thereto are enhanced in a well-balanced manner. The lower limit of percentage $\{X_{Si}/(X_{Si}+X_{Ti})\} \times 100$ in each of the silicon high-concentration layer and the silicon low-concentration layer is preferably 0.1% or more, 0.5% or more, 0.7% or more, 1.0% or more, 1.2% or more, from the viewpoint of enhancements in wear resistance and oxidation resistance. The upper limit of percentage $\{X_{Si}/(X_{Si}+X_{Ti})\} \times 100$ in each of the silicon high-concentration layer and the silicon low-concentration layer is preferably 10.0% or less, 8.0% or less, 7.2% or less, 7.0% or less, 5% or less, from the viewpoint of not only maintenance of a columnar structure, but also an enhancement in wear resistance. Percentage $\{X_{Si}/(X_{Si}+X_{Ti})\} \times 100$ in each of the silicon high-concentration layer and the silicon low-concentration layer is preferably 0.1% or more and 10.0% or less, 0.5% or more and 10.0% or less, 0.7% or more and 10.0% or less, 1.0% or more and 10.0% or less, 1.2% or more and 10.0% or less, 0.1% or more and 8.0% or less, 0.5% or more and 8.0% or less, 0.7% or more and 8.0% or less, 1.0% or more and 8.0% or less, 1.2% or more and 8.0% or less, 0.1% or more and 7.2% or less, 0.5% or more and 7.2% or less, 0.7% or more and 7.2% or less, 1.0% or more and 7.2% or less, 1.2% or more and 7.2% or less, 0.1% or more and 7.0% or less, 0.5% or more and 7.0% or less, 0.7% or more and 7.0% or less, 1.0% or more and 7.0% or less, 1.2% or more and 7.0% or less, 0.1% or more and 5% or less, 0.5% or more and 5% or less, 0.7% or more and 5% or less, 1.0% or more and 5% or less, 1.2% or more and 5% or less.

The lower limit of percentage $\{X_{Si}/(X_{Si}+X_{Ti})\} \times 100$ in the silicon high-concentration layer is preferably 1% or more, preferably 1.5% or more, 2.0% or more, 5.3% or more, 6.0% or more, from the viewpoint of an enhancement in heat resistance. The upper limit of percentage $\{X_{Si}/(X_{Si}+X_{Ti})\} \times 100$ in the silicon high-concentration layer is preferably 10.0% or less, 9.0% or less, 8.0% or less, from the viewpoint of maintenance of a cubic crystal structure. Percentage $\{X_{Si}/(X_{Si}+X_{Ti})\} \times 100$ in the silicon high-concentration layer is preferably 1% or more and 10.0% or less, 1.5% or more and 10.0% or less, 2.0% or more and 10.0% or less, 5.3% or more and 10.0% or less, 6.0% or more and 10.0% or less, 1% or more and 9.0% or less, 1.5% or more and 9.0% or less, 2.0% or more and 9.0% or less, 5.3% or more and 9.0% or less, 6.0% or more and 9.0% or less, 1% or more and 8.0% or less, 1.5% or more and 8.0% or less, 2.0% or more and 8.0% or less, 5.3% or more and 8.0% or less, 6.0% or more and 8.0% or less. When the composition of the silicon high-concentration layer is changed in the thickness direction, percentage $\{X_{Si}/(X_{Si}+X_{Ti})\} \times 100$ in the silicon high-concentration layer means the average value in the entire silicon high-concentration layer in a region where line analysis is performed The lower limit of percentage $\{X_{Si}/(X_{Si}+X_{Ti})\} \times 100$ in the silicon low-concentration layer is preferably 0.1% or more, 0.2% or more, 0.5% or more, from the viewpoint of an enhancement in adhesiveness. The upper limit of percentage $\{X_{Si}/(X_{Si}+X_{Ti})\} \times 100$ in the silicon low-concentration layer is preferably 2.0% or less, 1.5% or less, 1.2% or less, from the viewpoint of consistency between cubic crystals. Percentage $\{X_{Si}/(X_{Si}+X_{Ti})\} \times 100$ in the silicon low-concentration layer is preferably 0.1% or more and 2.0% or less, 0.2% or more and 2.0% or less, 0.5% or more and 2.0% or less, 0.1% or more and 1.5% or less, 0.2% or more and 1.5% or less, 0.5% or more and 1.5% or less, 0.1% or more and 1.2% or less, 0.2% or more and 1.2% or less, 0.5% or more and 1.2% or less. When the composition of the silicon low-concentration layer is changed in the thickness direction, percentage $\{X_{Si}/(X_{Si}+X_{Ti})\} \times 100$ in the silicon low-concentration layer means the average value in the entire silicon low-concentration layer in a region where line analysis is performed.

The difference between percentage $\{X_{Si}/(X_{Si}+X_{Ti})\} \times 100$ in the silicon high-concentration layer and percentage $\{X_{Si}/(X_{Si}+X_{Ti})\} \times 100$ in the silicon low-concentration layer is preferably 0.5% or more and less than 10%, preferably 1% or more and 9% or less, preferably 2% or more and 8% or less, preferably 4% or more and 8% or less, from the viewpoint of an enhancement in hardness It has been confirmed that, as long as measurement is performed in the same sample, measurement results are obtained with almost no variation and there is no arbitrariness even with a measurement point arbitrarily set, even if the hard grain specified in (A2) above is changed and percentage $\{X_{Si}/(X_{Si}+X_{Ti})\} \times 100$ in the silicon high-concentration layer and percentage $\{X_{Si}/(X_{Si}+X_{Ti})\} \times 100$ in the silicon low-concentration layer are measured multiple times.

<<Crystal Orientations in Silicon High-Concentration Layer and Silicon Low-Concentration Layer>>

The silicon high-concentration layer and the low silicon concentration layer preferably have the same crystal orientation. According to this, interface energy is suppressed. Examples of the crystal orientation include {311}, {211}, {110}, {100}, and {111}. In the crystallographic description herein, { } represents an aggregated plane.

The silicon high-concentration layer and the silicon low-concentration layer having the same crystal orientation is confirmed by the following procedure. An electron diffraction image illustrated in FIG. 9 is obtained by the same methods as (A1) to (A4) described above. When the electron diffraction image is a diffraction image derived from a single crystal, it is determined that the silicon high-concentration layer and the silicon low-concentration layer have the same crystal orientation.

<<Periodic Width of Lamellar Structure>>

The average periodic width in the lamellar structure in the present embodiment is preferably 2 nm or more and 20 nm or less, preferably 3 nm or more and 17.7 nm or less, preferably 4 nm or more and 15 nm or less, preferably 5 nm or more and 10 nm or less, from the viewpoint that the strain between the silicon high-concentration layer and the silicon low-concentration layer is maintained and defect resistance is enhanced. Here, the periodic width in the lamellar structure refers to a distance from one silicon high-concentration layer to other silicon high-concentration layer adjacent thereto with a silicon low-concentration layer adjacent to such one silicon high-concentration layer and being interposed therebetween. The distance is defined as a distance connecting the respective midpoints in the thickness directions of the silicon high-concentration layer and the other silicon high-concentration layer. The average periodic width in the lamellar structure means the average of all the periodic widths in the lamellar structure subjected to measurement in the measurement region set in (A3) above.

Figure 11:
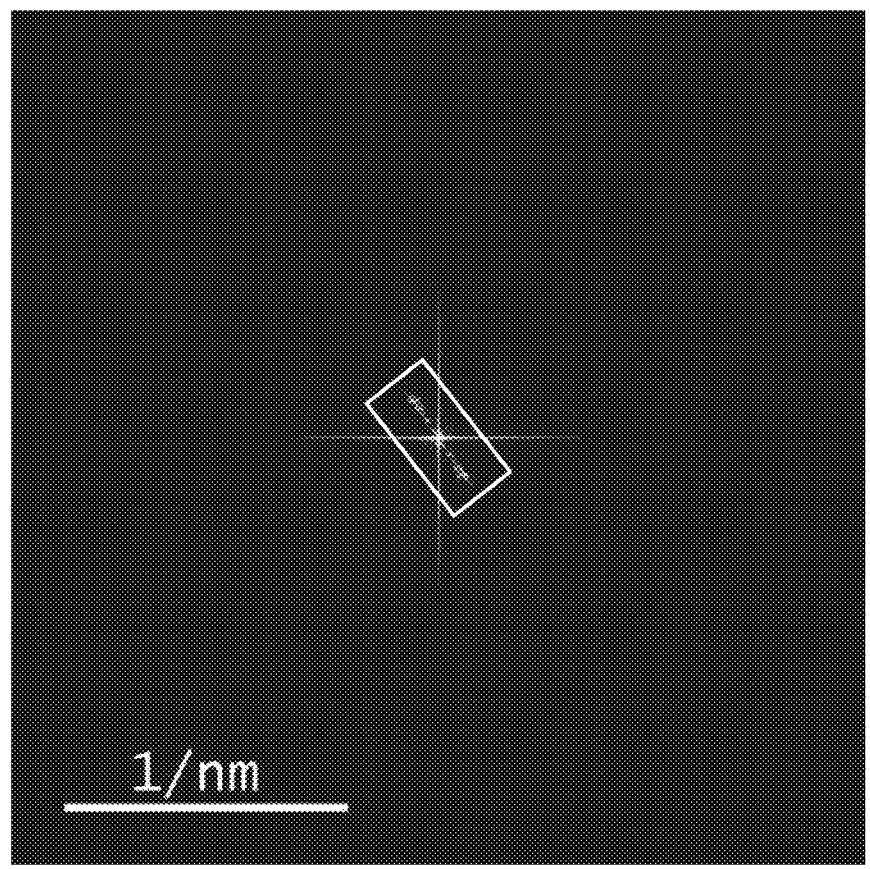
FIG. 11 is a Fourier transform image obtained by subjecting region A illustrated in FIG. 8 to Fourier transform.
Figure 12:
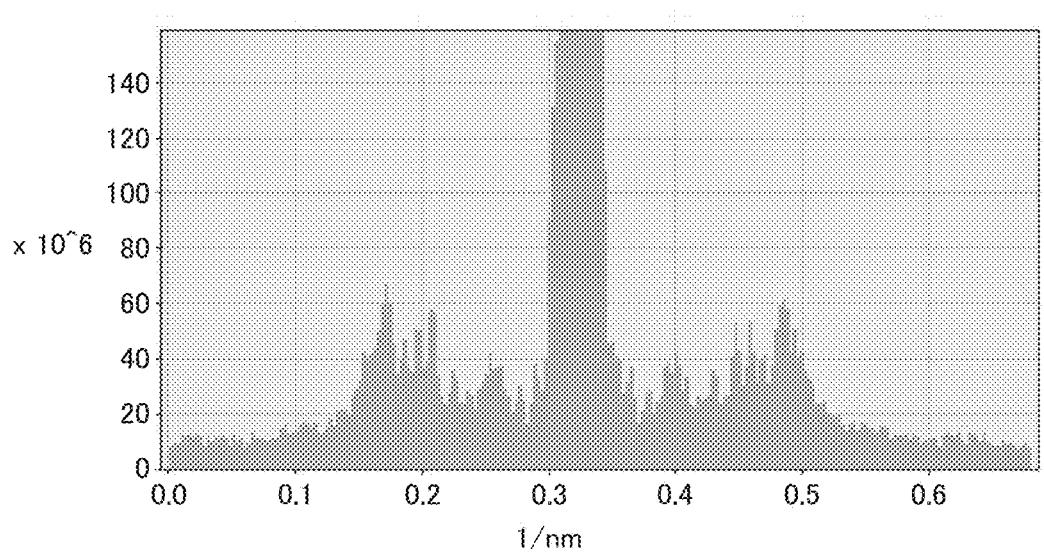
FIG. 12 is a graph representing an intensity profile in a quadrangular frame in the Fourier transform image of FIG. 11.

In the present specification, the method for measuring the periodic width of the silicon concentration is as follows. A measurement region is set by the same methods as in (A1) to (A3) above. The measurement region is subjected to Fourier transform, and a Fourier transform image is thus obtained. FIG. 11 illustrates a Fourier transform image obtained by subjecting region A illustrated in FIG. 8 to Fourier transform. The periodicity in the measurement region in the Fourier transform image appears in the form of a spot. FIG. 12 illustrates a graph representing an intensity profile in a frame of a rectangular shape in the Fourier transform image of FIG. 11. In the system of coordinates in FIG. 12, the X-axis represents a longitudinal direction of the rectangular shape in FIG. 11, and the Y-axis represents the intensity in FIG. 11. The periodic width is calculated by calculating the reciprocal of the distance between the spot and a center of the Fourier transform image, the center representing the maximum intensity.

It has been confirmed that, as long as measurement is performed in the same sample, measurement results are obtained with almost no variation and there is no arbitrariness even with a measurement point arbitrarily set, even if a measurement point is changed and the measurement is performed multiple times.

The number of stacked layers (total number of stacked layers) with respect to each of the silicon high-concentration layer and the silicon low-concentration layer constituting the lamellar structure is not particularly limited, and is, for example, preferably 10 layers or more and 1000 layers or less. When the number of stacked layers is 10 layers or more, crystal grains in such each silicon high-concentration layer and such each silicon low-concentration layer are inhibited from being coarsened, and the hard grains can maintain hardness thereof. On the other hand, when the number of stacked layers is 1000 layers or less, the thicknesses of such each silicon high-concentration layer and such each silicon low-concentration layer can be sufficiently secured, and unit layers can be inhibited from being mixed <<Aspect Ratio of Hard Grains>>

In the present embodiment, the average aspect ratio of the hard grains is preferably 2.0 or more. According to this, the first layer has a columnar structure to thereby allow the crack progress direction to have anisotropy, and thus the coating film is enhanced in peeling resistance. The lower limit of the average aspect ratio of the hard grains is preferably 2 or more, 4 or more, 5 or more, 6 or more, 7 or more, 8 or more, from the viewpoint of an enhancement in peeling resistance. The upper limit of the aspect ratio of the hard grains is preferably 20 or less, 18 or less, 15 or less, 13 or less, 10 or less, from the viewpoint of maintaining of a columnar structure. The aspect ratio of the hard grains is preferably 2 or more and 20 or less, 4 or more and 20 or less, 5 or more and 20 or less, 6 or more and 20 or less, 7 or more and 20 or less, 8 or more and 20 or less, 2 or more and 18 or less, 4 or more and 18 or less, 5 or more and 18 or less, 6 or more and 18 or less, 7 or more and 18 or less, 8 or more and 18 or less, 2 or more and 15 or less, 4 or more and 15 or less, 5 or more and 15 or less, 6 or more and 15 or less, 7 or more and 15 or less, 8 or more and 15 or less, 2 or more and 13 or less, 4 or more and 13 or less, 5 or more and 13 or less, 6 or more and 13 or less, 7 or more and 13 or less, 8 or more and 13 or less, 2 or more and 10 or less, 4 or more and 10 or less, 5 or more and 10 or less, 6 or more and 10 or less, 7 or more and 10 or less, 8 or more and 10 or less.

In the present specification, the average aspect ratio of the hard grains is measured by the following procedures (a1) to (d1).

(a1) The cutting tool is cut by a diamond wire along with a normal line of the surface of the coating film, and a cross section of the first layer is thus exposed. The cross section exposed is subjected to focusing ion beam processing (hereinafter, also designated as "FIB processing".), and the cross section is thus in a mirror state.

(b1) A rectangular observation field of view in the cross section subjected to FIB processing is set. A pair of sides of the measurement field of view each has a length of 30 μm in a direction in parallel with the surface of the substrate, and other pair of sides each has a length (the thickness of the first layer) so that the entire first layer in a normal line direction of the surface of the substrate is included.

(c1) A high-resolution electron beam backscatter diffraction apparatus is used to analyze the plane in the observation field of view at an interval of 0.02 μm, and a measurement point having a cubic crystal structure (hereinafter, also designated as "cubic structure".) in the plane in the observation field of view is determined. Among the measurement points, when the orientation difference between a measurement point A having a cubic structure and a measurement point B adjacent to measurement point A is 5 degrees or more, a grain boundary is defined to be between measurement point A and measurement point B. When no measurement point having a cubic structure, adjacent to measurement point A, is present, a grain boundary is defined as the outer periphery of measurement point A.

One including a measurement point having a cubic structure in a region surrounded by the grain boundary is defined as one crystal grain Herein, when the orientation difference between a specified measurement point and all measurement points adjacent thereto is 5 degrees or more, or when the measurement point has no cubic structure and is present singly, the measurement point is not determined as a crystal grain. In other words, one where two or more measurement points are connected is handled as a crystal grain. The grain boundary is thus determined, and each crystal grain is specified.

(d1) Next, image processing is performed to determine a maximum length H in a normal line direction of the surface of the substrate, a maximum length W in a direction in parallel with the surface of the substrate, and an area S, with respect to each crystal grain. An aspect ratio A of such each crystal grain is calculated as A=H/W. Twenty crystal grains $P_1$ to $P_{20}$ are arbitrarily selected in the observation field of view. The aspect ratio is determined with respect to each of the twenty crystal grains. An area-weighted average $A_{ave}$ of aspect ratios A of twenty crystal grains $P_1$ to $P_{20}$ is calculated based on the following expression 1.

$$A_{ave}=(A_1 S_1 + A_2 S_2 + \ldots + A_{20} S_{20})/(S_1 + S_2 + \ldots S_n) \quad \text{Expression 1}$$

In expression 1, $A_1$ to $A_{20}$ are respectively aspect ratios A of crystal grains $P_1$ to $P_{20}$. In expression 1, $S_1$ to $S_{20}$ are respectively areas S of crystal grains $P_1$ to $P_{20}$.

In the present specification, area-weighted average Awe obtained corresponds to the average aspect ratio of the hard grains. It has been confirmed that, as long as measurement is performed in the same sample, measurement results are obtained with almost no variation and there is no arbitrariness even with an observation field of view arbitrarily set, even if an observation field of view is changed and such measurement is performed multiple times.

<<Distribution of Silicon>>

The maximum value of percentage $\{A_{Si}/(A_{Si}+A_{Ti})\} \times 100$ of number $A_{Si}$ of silicon atoms to the sum of number $A_{Si}$ of silicon atoms and number $A_{Ti}$ of titanium atoms in the grain boundary region between the hard grains in the first layer in the present embodiment is larger than the average value of percentage $\{B_{Si}/(B_{Si}+B_{Ti})\} \times 100$ of number $B_{Si}$ of silicon atoms to the sum of number $B_{Si}$ of silicon atoms and number $B_{Ti}$ of titanium atoms in the first layer. According to this, strain occurs in the vicinity of the grain boundary and crack propagation is suppressed by the strain. Furthermore, oxidation of the hard grains in the vicinity of the grain boundary is suppressed. Therefore, the cutting tool can have a long tool life.

The difference between the maximum value of percentage $\{A_{Si}/(A_{Si}+A_{Ti})\} \times 100$ and the average value of percentage $\{B_{Si}/(B_{Si}+B_{Ti})\} \times 100$ is preferably 0.5% or more. This leads to a further enhancement in tool life. The lower limit of the difference is preferably 0.5% or more, 0.7% or more, 1.0% or more, 1.5% or more, 2.0% or more, from the viewpoint of enhancements in crack propagation resistance and oxidation resistance. The upper limit of the difference is preferably 9.5% or less, 8.0% or less, 4.0% or less, 3.0% or less, from the viewpoint of an enhancement in adhesiveness. The difference is preferably 0.5% or more and 9.5% or less, 0.7% or more and 9.5% or less, 1.0% or more and 9.5% or less, 1.5% or more and 9.5% or less, 2.0% or more and 9.5% or less, 0.5% or more and 8.0% or less, 0.7% or more and 8.0% or less, 1.0% or more and 8.0% or less, 1.5% or more and 8.0% or less, 2.0% or more and 8.0% or less, 0.5% or more and 4.0% or less, 0.7% or more and 4.0% or less, 1.0% or more and 4.0% or less, 1.5% or more and 4.0% or less, 2.0% or more and 4.0% or less, 0.5% or more and 3.0% or less, 0.7% or more and 3.0% or less, 1.0% or more and 3.0% or less, 1.5% or more and 3.0% or less, 2.0% or more and 3.0% or less.

The lower limit of the maximum value of percentage $\{A_{Si}/(A_{Si}+A_{Ti})\} \times 100$ is preferably 1.0% or more, 1.5% or more, 2.0% or more, 3.0% or more, from the viewpoint of enhancements in crack propagation resistance and oxidation resistance. The upper limit of the maximum value of percentage $\{A_{Si}/(A_{Si}+A_{Ti})\} \times 100$ is preferably 10.0% or less, 8.0% or less, 7.0% or less, from the viewpoint of an enhancement in interface adhesion force. The maximum value of percentage $\{A_{Si}/(A_{Si}+A_{Ti})\} \times 100$ is preferably 1.0% or more and 10.0% or less, 1.5% or more and 10.0% or less, 2.0% or more and 10.0% or less, 3.0% or more and 10.0% or less, 1.0% or more and 8.0% or less, 1.5% or more and 8.0% or less, 2.0% or more and 8.0% or less, 3.0% or more and 8.0% or less, 1.0/6 or more and 7.0% or less, 1.5% or more and 7.0% or less, 2.0% or more and 7.0% or less, 3.0% or more and 7.0% or less The lower limit of the average value of percentage $\{B_{Si}/(B_{Si}+B_{Ti})\} \times 100$ is preferably 0.5% or more, 0.6% or more, 1.0% or more, 1.5% or more, 2.0% or more, 2.5% or more, from the viewpoint of an enhancement in oxidation resistance. The upper limit of the average value of percentage $\{B_{Si}/(B_{Si}+B_{Ti})\} \times 100$ is preferably 10.0% or less, 8.1% or less, 8.0% or less, 7.0% or less, 5.0% or less, 4.9% or less, from the viewpoint of an enhancement in interface adhesion force. The average value of percentage $\{B_{Si}/(B_{Si}+B_{Ti})\} \times 100$ is preferably 0.5% or more and 10% or less, 0.6% or more and 10% or less, 1.0% or more and 10% or less, 1.5% or more and 10% or less, 2.0% or more and 10% or less, 2.5% or more and 10% or less, 0.5% or more and 8.1% or less, 0.6% or more and 8.1% or less, 1.0% or more and 8.1% or less, 1.5% or more and 8.1% or less, 2.0% or more and 8.1% or less, 2.5% or more and 8.1% or less, 0.5% or more and 8.0% or less, 0.6% or more and 8.0% or less, 1.0% or more and 8.0% or less, 1.5% or more and 8.0% or less, 2.0% or more and 8.0% or less, 2.5% or more and 8.0% or less, 0.5% or more and 7.0% or less, 0.6% or more and 7.0% or less, 1.0% or more and 7.0% or less, 1.5% or more and 7.0% or less, 2.0% or more and 7.0% or less, 2.5% or more and 7.0% or less, 0.5% or more and 5.0% or less, 0.6% or more and 5.0% or less, 1.0% or more and 5.0% or less, 1.5% or more and 5.0% or less, 2.0% or more and 5.0% or less, 2.5% or more and 5.0% or less, 0.5% or more and 4.9% or less, 1.0% or more and 4.9% or less, 1.5% or more and 4.9% or less, 2.0% or more and 4.9% or less, 2.5% or more and 4.9% or less.

In the present specification, the maximum value of percentage $\{A_{Si}/(A_{Si}+A_{Ti})\} \times 100$ is measured by subjecting the grain boundary region in a cross section along a normal line of the surface of the coating film, to line analysis at a length of 60 nm or more in a direction perpendicular to an extension direction of the grain boundary region between the hard grains, by use of STEM-EDX. Specifically, the measurement is made by the following methods (B1) to (B4).

(B1) The cutting tool is cut by a diamond wire along with a normal line of the surface of the coating film, and a thin piece sample (thickness about 100 nm) is provided in which a cross section of the first layer is exposed. The cross section exposed is subjected to focusing ion beam processing (hereinafter, also designated as "FIB processing".), and the cross section is thus in a mirror state.

Figure 13:
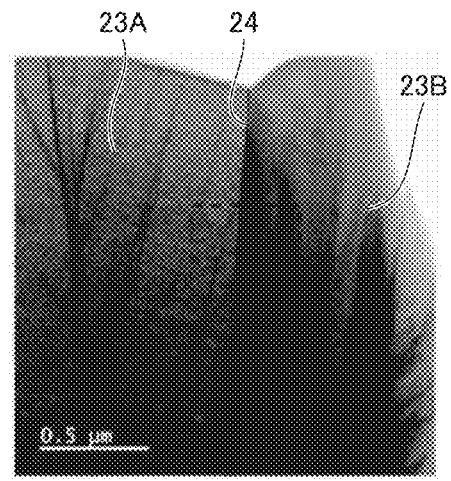
FIG. 13 is a view illustrating one example of a STEM image of the cutting tool according to embodiment 1.

(B2) The cross section subjected to FIB processing is observed with a scanning transmission electron microscopy (STEM), and the grain boundary between the hard grains is specified. The observation magnification is 100,000×. FIG. 13 is a view illustrating one example of a STEM image of the cutting tool according to embodiment 1. In FIG. 13, a grain boundary region 24 is observed between two hard grains 23A and 23B.

(B3) Positioning is performed so that the grain boundary region specified above passes through the neighborhood of the center of the image, and a HAADF-STEM image is obtained. The magnification is 500,000×. In the HAADF-STEM image obtained, the grain boundary region is present so as to extend from one end of the image through the neighborhood of the center of the image toward another end opposite to the one end.

The grain boundary region in the above HAADF-STEM image is subjected to element line analysis at a length of 60 nm or more in a direction perpendicular to an extension direction of the above grain boundary region by use of EDX attached to STEM, and the composition is measured. The direction perpendicular to an extension direction of the grain boundary region here means a direction along a straight line intersecting at an angle of 90°±5° against the extension direction of the grain boundary region. The hard grains in the present embodiment are columnar crystals extending in the thickness direction of the first layer, and thus the grain boundary region between the hard grains is almost a straight line. The beam diameter is 0.5 nm or less and the scan interval is 0.5 nm in line analysis.

Figure 14:
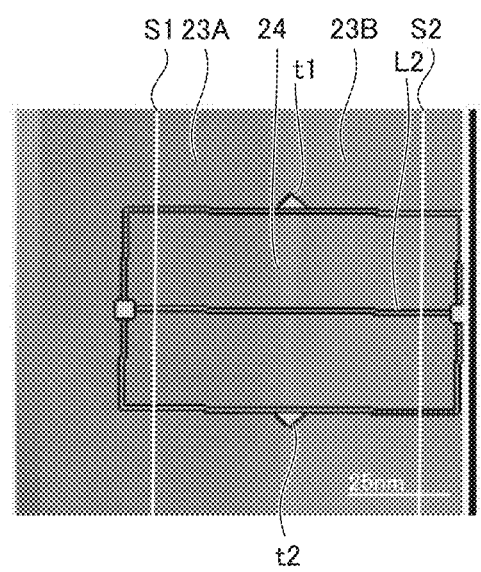
FIG. 14 is a view illustrating a HAADF-STEM image including a grain boundary region observed in FIG. 13.

The method for setting the measurement region in the element line analysis is described with reference to FIG. 14. In a HAADF-STEM image in FIG. 14, two adjacent hard grains 23A and 23B and grain boundary region 24 between the hard grains are specified. In FIG. 14, grain boundary region 24 stretches so as to include a straight line connecting apexes t1 and t2 of a triangle. In FIG. 14, a direction perpendicular to an extension direction of grain boundary region 24 is indicated by line L2. Accordingly, line analysis is performed along with line L2 in FIG. 14.

A virtual surface S1 is set in which the distance from grain boundary region 24 in an internal direction (left direction in FIG. 14) of hard grain 23A and a direction perpendicular to the extension direction of grain boundary region 24 is 30 nm or more A virtual surface S2 is set in which the distance from grain boundary region 24 in an internal direction (right direction in FIG. 14) of hard grain 23B and a direction perpendicular to the extension direction of grain boundary region 24 is 30 nm or more. A region sandwiched between virtual surface S1 and virtual surface S2 is defined as a measurement region in line analysis. In other words, the length in line analysis is 60 nm or more. Furthermore, the measurement region in line analysis is set within a region (hereinafter, also designated as "first region".) in which the distance from an interface on the substrate of the first layer is 500 nm or more and the distance from an interface (which is the surface of the first layer when the first layer corresponds to the outermost surface) on the surface of the coating film of the first layer is 500 nm or more. It has been confirmed as long as measurement is performed by the applicant that, as long as the measurement region in line analysis is located in the first region, measurement results are obtained with almost no variation and there is no arbitrariness even with a measurement point arbitrarily set, even if line analysis is performed in a different measurement region.

The maximum value of percentage $\{A_{Si}/(A_{Si}+A_{Ti})\}\times100$ in the measurement region is calculated from the results of line analysis. A specific calculation method is described with reference to FIG. 15.

Figure 15:
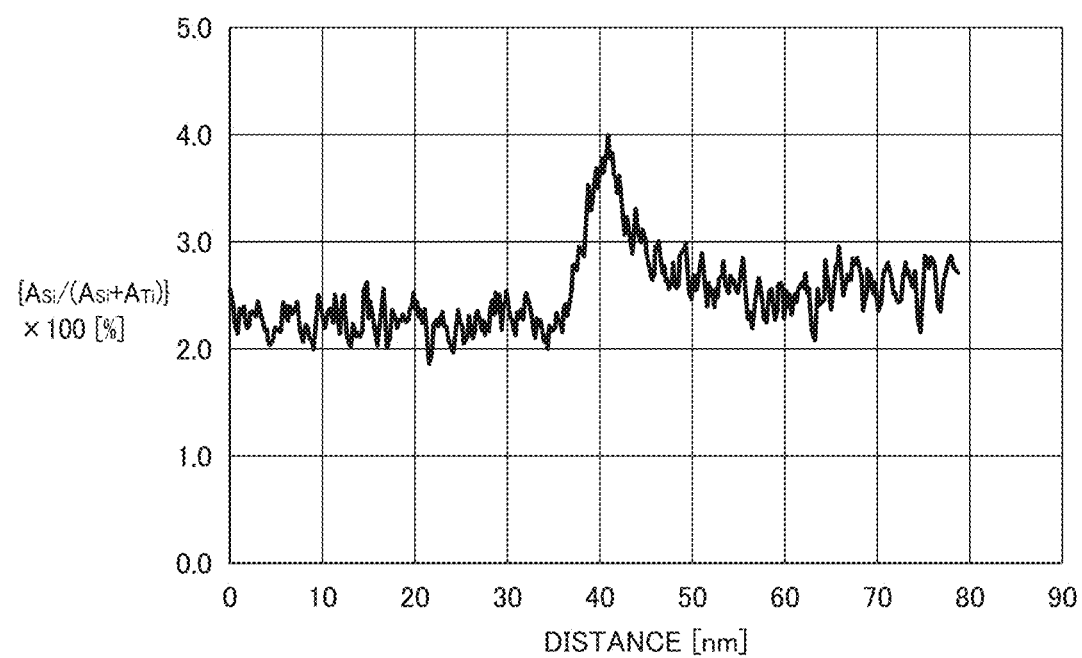
FIG. 15 is a graph representing the results of line analysis along with a line L2 in FIG. 14.

FIG. 15 is a graph representing the results of line analysis performed along with line L2 in FIG. 14 In the graph, the horizontal axis (X-axis) represents the distance (nm) from one end of the measurement region in line analysis, and the vertical axis (Y-axis) represents percentage $\{A_{Si}/(A_{Si}+A_{Ti})\}\times100(\%)$. In FIG. 15, the maximum value of percentage $\{A_{Si}/(A_{Si}+A_{Ti})\}\times100(\%)$ at a distance of about 41 nm is 4.0%.

(B4) The above measurement is performed in five such measurement regions which are different, set on each grain boundary. The average value of the maximum values of percentages $\{A_{Si}/(A_{Si}+A_{Ti})\}\times100$, in the five measurement regions, is calculated. In the present embodiment, the average value is defined as the maximum value of percentage $\{A_{Si}/(A_{Si}+A_{Ti})\}\times100$ in the grain boundary region between the hard grains. It has been confirmed as long as measurement is performed by the applicant that measurement results are obtained with almost no variation and there is no arbitrariness even with a measurement point arbitrarily set, even if a grain boundary as a measurement subject is arbitrarily selected.

In the present specification, the average value of percentage $\{B_{Si}/(B_{Si}+B_{Ti})\}\times100$ is measured by subjecting a rectangular measurement field of view of 100 nm×100 nm provided in the first layer in a cross section along a normal line of the surface of the coating film, to rectangular analysis by use of STEM-EDX. Specifically, the measurement is made by the following methods (C1) to (C4).

(C1) The cutting tool is cut by a diamond wire along with a normal line of the surface of the coating film, and a thin piece sample (thickness about 100 nm) is provided in which a cross section of the first layer is exposed. The cross section exposed is subjected to focusing ion beam processing (hereinafter, also designated as "FIB processing".), and the cross section is thus in a mirror state.

(C2) The cross section subjected to FIB processing is observed with a scanning transmission electron microscopy (STEM), and the first layer is specified. The observation magnification is 500,000×. A BF-STEM of the first layer is obtained. A rectangular measurement region of 100 nm×100 nm is set in the BF-STEM image. The measurement region is set within a region (hereinafter, also designated as "second region".) in which the distance from an interface on the substrate of the first layer is 500 nm or more and the distance from an interface (which is the surface of the first layer when the first layer corresponds to the outermost surface) on the surface of the coating film of the first layer is 500 nm or more. It has been confirmed as long as measurement is performed by the applicant that, as long as the measurement region in rectangular analysis is located in the second region, measurement results are obtained with almost no variation and there is no arbitrariness even with a measurement point arbitrarily set, even if rectangular analysis is performed in a different measurement region.

(C3) The measurement region is subjected to rectangular analysis with EDX attached to STEM, and the composition is measured. The beam diameter is 0.5 nm or less and the scan interval is 0.5 nm in rectangular analysis.

The average composition in the measurement region is calculated from the results of rectangular analysis. Percentage $\{B_{Si}/(B_{Si}+B_{Ti})\}\times100$ in the above measurement region is calculated based on the average composition.

(C4) The above measurement is performed in each of five different measurement regions, and percentage $\{B_{Si}/(B_{Si}+B_{Ti})\}\times100$ is calculated in each of the measurement regions. The average value of percentages $\{B_{Si}/(B_{Si}+B_{Ti})\}\times100$ in the five measurement regions is calculated. In the present embodiment, the average value is defined as the average value of percentage $\{B_{Si}/(B_{Si}+B_{Ti})\}\times100$ in the first layer.

It has been confirmed as long as measurement is performed by the applicant that measurement results are obtained with almost no variation and there is no arbitrariness even with a measurement point arbitrarily set, even if the measurement region is arbitrarily selected.

<Foundation Layer>

The coating film preferably includes a foundation layer disposed between the substrate and the first layer. The foundation layer is preferably made of a compound made of one or more elements selected from the group consisting of Group 4 elements, Group 5 elements and Group 6 elements in the periodic table, and aluminum, and one or more elements selected from the group consisting of carbon, nitrogen, boron and oxygen. According to this, adhesiveness between the coating film and the substrate is enhanced, and wear resistance is also enhanced.

A TiN layer, a TiC layer, a TiCN layer or a TiBN layer is disposed as the foundation layer directly on the substrate, and thus can increase adhesiveness between the substrate and the coating film. An $Al_2O_3$ layer is used as the foundation layer, and thus can increase oxidation resistance of the coating film. The average thickness of the foundation layer is preferably 0.1 µm or more and 20 µm or less. According to this, the coating film can have excellent wear resistance and defect-resistant property.

<Surface Layer>

The coating film preferably includes a surface layer disposed on the outermost surface thereof. The surface layer is preferably made of a compound made of one or more elements selected from the group consisting of Group 4 elements, Group 5 elements and Group 6 elements in the periodic table, and aluminum, and one or more elements selected from the group consisting of carbon, nitrogen, boron and oxygen. According to this, the coating film is enhanced in thermal crack resistance and wear resistance.

The surface layer is a layer disposed on the outermost surface side of the coating film. Herein, the layer is not sometimes formed on a blade edge line portion. The surface layer is disposed, for example, directly on the first layer.

Examples of the surface layer include a TiN layer or an $Al_2O_3$ layer. A TiN layer is bright in color (displays gold), and thus has the advantage of facilitating recognition of a corner of a cutting tip used for cutting (recognition of a part used) when used as the surface layer. An $Al_2O_3$ layer is used as the surface layer, and thus can increase oxidation resistance of the coating film.

The average thickness of the surface layer is preferably 0.05 µm or more and 2.0 µm or less. According to this, the coating film is enhanced in oxidation resistance.

<First Intermediate Layer>

The first intermediate layer is a layer disposed between the foundation layer and the first layer. When the foundation layer is a TiN layer, the first intermediate layer is preferably a TiCN layer. A TiCN layer is excellent in wear resistance, and thus can impart more suitable wear resistance to the coating film. The average thickness of the first intermediate layer is preferably 1 µm or more and 20 µm or less.

<Second Intermediate Layer>

The second intermediate layer is a layer disposed between the first layer and the surface layer. When the surface layer is an $Al_2O_3$ layer, the second intermediate layer is preferably a TiCNO layer. Thus, adhesiveness between the first layer and the surface layer is enhanced. The average thickness of the second intermediate layer is preferably 0.1 μm or more and 3 μm or less.

Embodiment 2: Method for Manufacturing Cutting Tool

Figure 16:
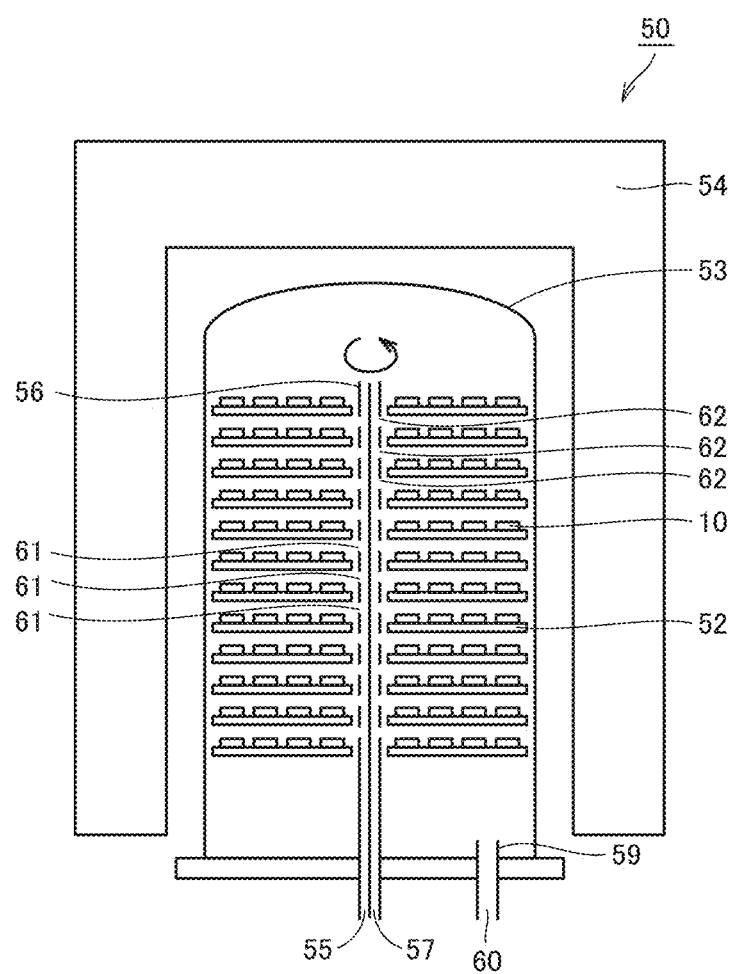
FIG. 16 is a schematic cross-sectional view of one example of a CVD apparatus for use in a method for manufacturing a cutting tool according to embodiment 2.

A method for manufacturing a cutting tool of the present embodiment is described with reference to FIG. 16. FIG. 16 is a schematic cross-sectional view of one example of a CVD apparatus for use in production of the cutting tool of the present embodiment.

The method for manufacturing a cutting tool of the present embodiment is the method for manufacturing a cutting tool described with respect to embodiment 1, including
step 1 of providing a substrate,
step 2 of forming a coating film on the substrate, and
step 3 of subjecting the coating film to a heat treatment to obtain a cutting tool, wherein
the coating film formed in step 2 comprises a first layer formed from a plurality of hard grains,
the hard grains are made of TiSiCN having a cubic crystal structure, and
the hard grains have a lamellar structure in which a layer having a relatively high silicon concentration and a layer having a relatively low silicon concentration are alternately stacked.

<Step 1>

In step 1, a substrate is provided. The details of the substrate are described with respect to embodiment 1, and thus the description thereof is not here repeated.

<Step 2>

Next, in step 2, a coating film is formed on the substrate. The coating film is formed, for example, using a CVD apparatus illustrated in FIG. 16. A plurality of substrate setting jigs 52 each holding substrate 10 can be installed in a CVD apparatus 50, and are each covered with a reaction vessel 53 made of heat-resistant alloy steel. A temperature control apparatus 54 is disposed around reaction vessel 53, and the temperature in reaction vessel 53 can be controlled by temperature control apparatus 54.

A nozzle 56 having three introduction ports 55 and 57 (another introduction port is not illustrated) is disposed in CVD apparatus 50. Nozzle 56 is disposed so as to pass through a region in which substrate setting jigs 52 are disposed. A plurality of spray holes (first spray hole 61, second spray hole 62, and third spray hole (not illustrated)) are formed on a section of nozzle 56, the section being in the vicinity of substrate setting jigs 52.

Respective gases introduced through introduction ports 55 and 57 and another introduction port (not illustrated) into nozzle 56 in FIG. 16 are not mixed even in nozzle 56, and are respectively introduced into reaction vessel 53 through different spray holes. Nozzle 56 can be rotated with an axis thereof as the center axis. An exhaust pipe 59 is disposed in CVD apparatus 50, and an exhaust gas can be discharged outside from an exhaust port 60 of exhaust pipe 59. The jigs and the like in reaction vessel 53 are usually constituted from graphite.

When the coating film includes the foundation layer, the intermediate layer and/or the surface layer, such layers can be each formed by a conventionally known method.

<<Step 2a>>

Preferably, step 2 includes step 2a of forming the first layer by a CVD method with a CVD apparatus,
step 2a includes step 2a-1 of spraying a $TiCl_4$ gas, a $SiCl_4$ gas and a $CH_3CN$ gas toward a surface of the substrate,
the $TiCl_4$ gas is sprayed through a plurality of first spray holes provided on a nozzle of the CVD apparatus,
the $SiCl_4$ gas is sprayed through a plurality of second spray holes provided on the nozzle,
the $CH_3CN$ gas is sprayed through a plurality of third spray holes provided on the nozzle,
the nozzle is rotated in step 2a-1,
the plurality of second spray holes include a second-first spray hole and a second-second spray hole, and
a diameter r1 of the second-first spray hole is different from a diameter r2 of the second-second spray hole.

The $TiCl_4$ gas is sprayed through a plurality of first spray holes provided on the nozzle, the $SiCl_4$ gas is sprayed through a plurality of second spray holes provided on the nozzle, and the $CH_3CN$ gas is sprayed through a plurality of third spray holes provided on the nozzle. Specifically, the $TiCl_4$ gas is introduced into nozzle 56 through introduction port 55 of the nozzle, and is sprayed through a plurality of first spray holes 61. The $SiCl_4$ gas is introduced into nozzle 56 through introduction port 57 of the nozzle, and is sprayed through a plurality of second spray holes 62. The $CH_3CN$ gas is introduced into nozzle 56 through an introduction port (not illustrated) of the nozzle, and is sprayed through a plurality of third spray holes (not illustrated).

The nozzle is rotated in step 2a-1, the plurality of second spray holes include a second-first spray hole and a second-second spray hole, and a diameter r1 of the second-first spray hole is different from a diameter r2 of the second-second spray hole. According to this, the hard grains can have a lamellar structure in which a layer having a relatively high silicon concentration and a layer having a relatively low silicon concentration are alternately stacked. In order to facilitate understanding below, the description is made under the assumption that r1<r2 is satisfied.

The diameter r1 of the second-first spray hole is preferably 0.5 mm or more and 3 mm or less, more preferably 1 mm or more and 2.5 mm or less, further preferably 1.5 mm or more and 2 mm or less. The diameter r2 of the second-second spray hole is preferably 1 mm or more and 4 mm or less, more preferably 1.5 mm or more and 3.5 mm or less, further preferably 2 mm or more and 3 mm or less.

The lower limit of a ratio r1/r2 of the diameter r1 of the second-first spray hole to the diameter r2 of the second-second spray hole is preferably 0.125 or more, more preferably 0.2 or more, further preferably 0.5 or more. The upper limit of r1/r2 is preferably less than 1, preferably 0.8 or less, preferably 0.6 or less. r1/r2 is preferably 0.125 or more and less than 1, preferably 0.2 or more and 0.8 or less, preferably 0.5 or more and 0.6 or less.

In the present step, the substrate temperature in the reaction vessel is preferably in the range from 700 to 900° C., and the pressure in the reaction vessel is preferably 0.1 to 13 kPa. The carrier gas here used can be, for example, a $H_2$ gas, a $N_2$ gas, or an Ar gas. The carrier gas is sprayed through the third spray holes, together with the $CH_3CN$ gas.

The compositions of the layer having a relatively high silicon concentration and the layer having a relatively low silicon concentration in the lamellar structure can be controlled by the mixing ratio of raw material gases, and r1/r2 of the diameter r1 of the second-first spray hole to the diameter r2 of the second-second spray hole. The thickness of the first layer can be controlled by regulating the flow rates of the raw material gases and the film formation time.

The respective thicknesses of a first unit layer and a second unit layer, the stacking period of these layers, and the number of such stacked layers can be controlled by regulating the rotational speed of the nozzle, and the film formation time.

In formation of the first layer, the total flow rate of a reaction gas can be, for example, 70 to 90 L/min. Such "total flow rate of gas" is the total volume flow rate introduced into a CVD furnace, per unit time, under the assumption that gases in a standard state (0° C., 1 atm) are ideal gases.

The coating film formed in step 2 comprises a first layer formed from a plurality of hard grains, the hard grains are made of TiSiCN having a cubic crystal structure and have a lamellar structure in which a layer having a relatively high silicon concentration and a layer having a relatively low silicon concentration are alternately stacked.

<Step 3>

Next, in step 3, the coating film formed in step 2 is a subjected to heat treatment, and the cutting tool described in embodiment 1 is obtained. Thus, silicon in the hard grains is transferred to the vicinity of the grain boundary between the hard grains, and the maximum value of percentage $\{A_{Si}/(A_{Si}+A_{Ti})\} \times 100$ of number $A_{Si}$ of silicon atoms to the sum of number $A_{Si}$ of silicon atoms and number $A_{Ti}$ of titanium atoms in the grain boundary region between the hard grains is larger than the average value of percentage $\{B_{Si}/(B_{Si}+B_{Ti})\} \times 100$ of number $B_{Si}$ of silicon atoms to the sum of number $B_{Si}$ of silicon atoms and number B-n of titanium atoms in the first layer.

The heat treatment preferably includes heating the coating film at 1050° C. or more and 1100° C. or less in a hydrogen atmosphere at a pressure of 850 hPa or more and 950 hPa or less for 5 minutes or more and 30 minutes or less. According to this, transfer of silicon in the hard grains toward the grain boundary region is promoted.

<Other Steps>

Next, substrate 10 on which the coating film is formed is cooled. The cooling rate is, for example, not more than 5° C./min. and the cooling rate is lower as the temperature of substrate 10 is lower Surface treatment step such as surface grinding or shot blasting can be performed in addition to the above steps

EXAMPLES

The present embodiment will be more specifically described with reference to Examples. However, the present embodiment is not limited by these Examples.

<Step 1: Providing of Substrate>

Substrate A to substrate D described in Table 1 below were provided. Specifically, a raw material powder of a compounding composition described in the "Compounding composition (% by mass)" column in Table 1 was uniformly mixed, and a mixed powder was obtained. In Table 1, "Balance" means that WC occupies the residue of the compounding composition (% by mass) Next, the mixed powder was pressurized and molded into a shape described in the "Shape" column in Table 1, and then sintered at 1300 to 1500° C. for 1 to 2 hours, and thus Substrate A to Substrate D each made of cemented carbide was obtained.

TABLE 1

| | Compounding composition (% by mass) | | | | | | | |
|---|---|---|---|---|---|---|---|---|
| Type | Co | VC | TiCN | Cr$_3$C$_2$ | NbC | TaC | WC | Shape |
| Substrate A | 10 | — | — | — | 0.1 | 2 | Balance | XNMU060608PNER-G |
| Substrate B | 6 | — | 4 | 0.1 | — | 1 | Balance | CMNG120408N-GU |
| Substrate C | 6 | — | 4 | 0.1 | — | 1 | Balance | CMNG120408N-GZ |
| Substrate D | 10 | — | — | — | 0.1 | 2 | Balance | SEET13T3AGSN-G |

<Step 2: Formation of Coating Film>

A coating film was formed on the surface of each of Substrate A to Substrate D obtained above. Specifically, the coating film was formed by forming a TiN layer (foundation layer), a TiCN layer (first intermediate layer), a TiSiCN layer (first layer), a TiCNO layer (second intermediate layer), and an Al$_2$O$_3$ layer (surface layer) in the listed order on the substrate.

<<Formation of TiN Layer (Foundation Layer), TiCN Layer (First Intermediate Layer), TiCNO Layer (Second Intermediate Layer), and Al$_2$O$_3$ Layer (Surface Layer)>>

In the case of formation of the TiN layer (foundation layer) and/or the TiCN layer (intermediate layer) and/or the Al$_2$O$_3$ layer (surface layer) in the coating film, such layers were each formed by a conventionally known CVD method. The formation conditions of such each layer are as shown in Table 2. For example, the "TiN (foundation layer)" row in Table 2 shows formation conditions of the TiN layer as the foundation layer. The description of the TiN layer (foundation layer) in Table 2 means that the TiN layer is formed by disposing the substrate in a reaction vessel (pressure in reaction vessel: 6.7 kPa; substrate temperature: 915° C.) of a CVD apparatus, and spraying, into the reaction vessel, a reaction gas (mixed gas composed of 2.0% by volume of TiCl$_4$ gas, 39.7% by volume of N$_2$ gas and H$_2$ gas as balance (58.3% by volume)) having a composition described in the "Composition (% by volume) of reaction gas" column in Table 2, at a flow rate (total flow rate of gas) of 63.8 L/min. The thicknesses of the respective layers formed in the formation conditions were controlled by the time for spraying of each gas in the reaction gas. Herein, the "total flow rate of gas" represents the total volume flow rate introduced into a CVD furnace, per unit time, under the assumption that gases in a standard state (0° C., 1 atm) are ideal gases.

TABLE 2

| Type | Composition (% by volume) of reaction gas | Pressure in reaction vessel (kPa) | Substrate temperature (° C.) | Total flow rate of gas (L/min) |
|---|---|---|---|---|
| TiN layer (Foundation layer) | $TiCl_4$ = 2.0%, $N_2$ = 39.7%, $H_2$ = balance | 6.7 | 915 | 63.8 |
| TiCN layer (First intermediate layer) | $TiCl_4$ = 2.0%, $CH_3CN$ = 0.7%, $H_2$ = balance | 9.0 | 860 | 50.5 |
| TiCNO layer (Second intermediate layer) | $TiCl_4$ = 2.1%, CO = 3.2%, $CH_4$ = 2.8%, $N_2$ = 23.7%, $H_2$ = balance | 16.0 | 1030 | 70.5 |
| $Al_2O_3$ layer (Surface layer) | $AlCl_3$ = 1.6%, $CO_2$ = 4.5%, $H_2S$ = 0.2%, HCl = 3.5%, $H_2$ = balance | 6.7 | 1000 | 46.2 |

<<Formation of TiSiCN Layer>>

A layer having a composition of TiSiCN (hereinafter, also designated as "TiSiCN layer".), in the coating film, is formed under any of Formation conditions A to Formation conditions D in Table 3 and Formation conditions X and Formation conditions Y in Table 4.

TABLE 3

| Formation conditions | | A | B | C | D |
|---|---|---|---|---|---|
| Formation method | | CVD | CVD | CVD | CVD |
| Temperature (° C.) | | 800 | 800 | 800 | 800 |
| Pressure (kPa) | | 9.0 | 9.0 | 9.0 | 9.0 |
| Composition of reaction gas (% by volume) | $SiCl_4$ | 0.7 | 1 | 1 | 0.7 |
| | $TiCl_4$ | 1 | 1 | 1 | 1 |
| | $CH_3CH$ | 0.5 | 0.5 | 0.5 | 0.3 |
| | $H_2$ | Balance | Balance | Balance | Balance |
| Nozzle diameter Φ (mm) r1/r2 | | 1.5/2.5 | 1.5/2.5 | 2.0/4.0 | 1.5/2.5 |
| Rotational speed (rpm) | | 2.0 | 10.0 | 2.0 | 1.0 |

TABLE 4

| Formation conditions | | X | Formation conditions | Y |
|---|---|---|---|---|
| Formation method | | Conventional CVD | Formation method | Conventional PVD |
| Temperature (° C.) | | 800 | Temperature (° C.) | 500 |
| Pressure (kPa) | | 6 | Pressure (kPa) | 0.03 |
| Composition of reaction gas (% by volume) | $SiCl_4$ | 0.84 | Composition of target metal | Ti/Si = 80/20 |
| | $TiCl_4$ | 0.17 | Arc current (A) | 150 |
| | $CH_3CH$ | 0.32 | Bias voltage (V) | −200 |
| | $H_2$ | Balance | N2/CH4 gas ratio | 1/1 |
| Nozzle diameter φ (mm) | | 10 | | |
| Rotational speed (rpm) | | — | | |

<<Formation Conditions A to Formation Conditions D>>

A TiSiCN layer (first layer) is formed by use of a CVD apparatus illustrated in FIG. 16, in Formation conditions A to Formation conditions D. First spray holes, second spray holes (second-first spray hole and the second-second spray hole) and third spray holes are provided in a nozzle of the CVD apparatus. A diameter φr1 of the second-first spray hole and a diameter φr2 of the second-second spray hole of the nozzle of the CVD apparatus used in each of the formation conditions are shown in the "Diameter φ (mm) of spray hole: r1/r2" column in Table 3. For example, diameter φr1 of the second-first spray hole is 1.5 mm and diameter φr2 of the second-second spray hole is 2.5 mm in Formation conditions A. The nozzle is rotated during layer formation.

In Formation conditions A to Formation conditions D, first, the pressure in the reaction vessel of the CVD apparatus is set to the pressure described in the "Pressure (kPa)" column in Table 3, and the substrate temperature is set to the temperature described in the "Temperature ° C." column in Table 3. For example, in Formation conditions A, the pressure in the reaction vessel of the CVD apparatus is set to 9.0 kPa and the substrate temperature is set to 800° C.

Next, a reaction gas including components described in the "Composition (% by volume) of reaction gas" column in Table 3 is introduced into the reaction vessel, and a TiSiCN layer (first layer) is formed on the substrate. In Table 3, the "Balance" means that a $H_2$ gas occupies the residue under the assumption that the reaction gas is 100% by volume in total $H_2$ is mixed with a $CH_3CN$ gas in order to adjust the total flow rate of gas.

In Formation conditions A to Formation conditions D, the total flow rate of the reaction gas is 80 L/min. The reaction gas used in Formation conditions A is constituted from 0.7% by volume of a $SiCl_4$ gas, 1% by volume of a $TiCl_4$ gas, 0.5% by volume of a $CH_3CH$ gas, and $H_2$ gas (balance 97.8% by volume).

The rotational speed of the nozzle during formation is as shown in the "Rotational speed (rpm)" column in Table 3. For example, the rotational speed of the nozzle is 20 rpm in Formation conditions A.

<<Formation Conditions X>>

A TiSiCN layer is formed in Formation conditions X by use of a conventional CVD apparatus. All diameters φ of the spray holes of the nozzle of the CVD apparatus are the same and are each 10 mm. The nozzle is not rotated during layer formation.

In Formation conditions X, first, the pressure in the reaction vessel of the CVD apparatus is set to 6 kPa, and the substrate temperature was set to 800° C.

Next, a reaction gas including components ($SiC_4$: 0.84% by volume, $TiCl_4$: 0.17% by volume, $CH_3CN$: 0.32% by volume, $H_2$: balance) described in the "Composition (% by volume) of reaction gas" column in Table 4 is introduced into the reaction vessel, and a TiSiCN layer is formed on the substrate. The total flow rate of the reaction gas is 80 L/min.

<<Formation Conditions Y>>

In Formation conditions Y, the first layer was formed by a conventional PVD method specific conditions of Formation conditions Y are as shown in the "Formation conditions Y" line in Table 4.

<Step 3: Heat Treatment>

Next, the coating film formed in step 2 was subjected to a heat treatment, and a cutting tool as each Sample was obtained. The conditions of the heat treatment are as shown in Heat treatment conditions C1 to Heat treatment conditions C3 in Table 5. For example, in Heat treatment conditions C1, the coating film was heated at 1100° C. for 10 minutes in a hydrogen ($H_2$) atmosphere at a pressure of 900 hP. Subsequently, the cutting tool was cooled.

TABLE 5

| Heat treatment conditions | C1 | C2 | C3 |
|---|---|---|---|
| Temperature (° C.) | 1100 | 1050 | 1050 |
| Pressure (hPa) | 900 | 900 | 900 |
| Time (min) | 10 | 30 | 15 |
| Atmosphere | $H_2$ | $H_2$ | $H_2$ |

A cutting tool as each Sample was obtained according to the above. The configuration of the coating film of each Sample is as shown in Table 6, Table 8, Table 10, Table 12, and Table 14 below. A to C, and X and Y in the "TiSiCN layer (first layer) (μm)" columns in these Tables mean respectively the layer formed by Formation conditions A to C shown in Table 3, and Formation conditions X and Formation conditions Y shown in Table 4, and numerical values in brackets each mean the thickness.

<Characteristics of TiSiCN Layer>
<<Structure of TiSiCN Layer>>

It was confirmed that the TiSiCN layers (first layer) formed using Formation conditions A to Formation conditions D were each formed from a plurality of hard grains, the hard grains were made of TiSiCN having a cubic crystal structure, and the hard grains had a lamellar structure in which the layer having a relatively high silicon concentration and the layer having a relatively low silicon concentration were alternately stacked. Furthermore, it was confirmed that the layer having a relatively high silicon concentration and the layer having a relatively low silicon concentration had the same crystal orientation. A specific confirmation method is as described with respect to embodiment 1, and thus the description thereof is not here repeated.

The TiSiCN layer obtained in Formation conditions X was observed by HAADF-STEM and was found to have a uniform structure, and no periodic change in structure was confirmed.

The TiSiCN layer obtained in Formation conditions Y was observed by HAADF-STEM, and a nanocomposite structure was thus confirmed and no periodic change in structure was confirmed.

<<Lamellar Structure>>

Respective percentages $\{X_{Si}/(X_{Si}+X_{Ti})\}\times 100$ in the silicon high-concentration layer and the silicon low-concentration layer in the lamellar structure of each Sample were measured. A specific measurement method is as described with respect to embodiment 1, and thus the description thereof is not here repeated. The results are shown in the "$\{X_{Si}/(X_{Si}+X_{Ti})\}\times 100(\%)$" column of "Silicon high-concentration layer" and the "$\{X_{Si}/(X_{Si}+X_{Ti})\}\times 100(\%)$" column of "Silicon low-concentration layer" of "Hard grains" in each of Table 7, Table 9, Table 11, Table 13, and Table 15. The designation "–" represents no measurement performed.

The average, the upper limit and the lower limit of the periodic width in the lamellar structure of each Sample were measured. A specific measurement method is as described with respect to embodiment 1, and thus the description thereof is not here repeated. The results are shown in the "Average (nm)". "Lower limit (nm)", and "Upper limit (nm)" columns of "Lamellar period" of "Hard grains" in each of Table 7, Table 9, Table 11, Table 13, and Table 15. The designation "–" represents no measurement performed.

<<Average Aspect Ratio of Hard Grains>>

The average aspect ratio of the hard grains of each Sample was measured A specific measurement method is as described with respect to embodiment 1, and thus the description thereof is not here repeated. The results are shown in the "Average aspect ratio" column of "Hard grains" in each of Table 7, Table 9, Table 11, Table 13, and Table 15.

<<Distribution of silicon>>

The maximum value of percentage $\{A_{Si}/(A_{Si}+A_{Ti})\}\times 100$ of number $A_{Si}$ of silicon atoms to the sum of number $A_{Si}$ of silicon atoms and number $A_{Ti}$ of titanium atoms in the grain boundary region between the hard grains in the TiSiCN layer (first layer) of each Sample, and the average value of percentage $\{B_{Si}/(B_{Si}+B_{Ti})\}\times 100$ of number $B_{Si}$ of silicon atoms to the sum of number $B_{Si}$ of silicon atoms and number $B_{Ti}$ of titanium atoms in the first layer were measured. Specific measurement methods are as described with respect to embodiment 1, and thus the description thereof is not here repeated. The results are shown in the "Maximum value of $\{A_{Si}/(A_{Si}+A_{Ti})\}\times 100$" column of "Grain boundary region" and the "Average value of $\{B_{Si}/(B_{Si}+B_{Ti})\}\times 100$" column of "First layer" in each of Table 7, Table 9, Table 11, Table 13, and Table 15.

TABLE 6

| Sample No. | Substrate | Configuration of coating film | | | | | Heat treatment |
|---|---|---|---|---|---|---|---|
| | | TiN layer (Foundation layer) (μm) | TiCN layer (First intermediate layer) (μm) | TiSiCN layer (First layer) (μm) | TiCNO layer (Second intermediate layer) (μm) | Al₂O₃ layer (Surface layer) (μm) | |
| 1 | B | 0.9 | 1.8 | A(8.2) | — | — | C1 |
| 2 | B | 0.9 | 1.8 | A(8.2) | — | — | C2 |
| 3 | B | 1.1 | 2.1 | A(8) | 0.5 | 1.5 | C1 |
| 4 | B | 1.1 | 2.1 | A(8) | 0.5 | 1.5 | C2 |
| 5 | B | — | — | A(11) | — | — | C1 |
| 6 | B | 1.0 | 1.9 | A(8.1) | — | — | C1 |
| 1-1 | B | 0.9 | 1.8 | A(8.2) | — | — | — |
| 1-2 | B | 1.1 | 2.1 | A(8) | 0.6 | 1.5 | — |
| 1-3 | B | 1.5 | 2 | X(8.5) | — | — | — |
| 1-4 | B | — | — | Y(12.0) | — | — | — |
| 1-5 | B | 1.5 | 2 | X(8.5) | — | — | C1 |
| 1-6 | B | — | — | Y(12.0) | — | — | C2 |
| 1-7 | B | — | — | X(11) | — | — | — |

TABLE 7

| Sample No. | Lamellar structure | Hard grains | | | | | | Grain boundary region | First layer | Cutting test |
|---|---|---|---|---|---|---|---|---|---|---|
| | | Silicon high-concentration layer | Silicon low-concentration layer | Lamellar period | | | | $\{A_{Si}/(A_{Si}+A_{Ti})\} \times 100$ | $\{B_{Si}/(B_{Si}+B_{Ti})\} \times 100$ | |
| | | $\{X_{Si}/(X_{Si}+X_{Ti})\} \times 100$ (%) | $\{X_{Si}/(X_{Si}+X_{Ti})\} \times 100$ (%) | Average (nm) | Lower limit (nm) | Upper limit (nm) | Average aspect ratio | Maximum value (%) | Average value (%) | Cutting distance (km) |
| 1 | Presence | 6.5 | 1.2 | 7.1 | 6.3 | 8.5 | 9.7 | 4.0 | 2.5 | 5.1 |
| 2 | Presence | 6.5 | 1.2 | 7.1 | 6.3 | 8.5 | 9.7 | 3.5 | 2.5 | 4.8 |
| 3 | Presence | 6.7 | 1.1 | 7.1 | 6.3 | 8.5 | 9.7 | 4.1 | 2.6 | 7.5 |
| 4 | Presence | 6.7 | 1.1 | 7.1 | 6.3 | 8.5 | 9.7 | 3.8 | 2.6 | 7.5 |
| 5 | Presence | 6.6 | 1.1 | 7.4 | 6.0 | 8.4 | 7.0 | 3.8 | 2.5 | 3.9 |
| 6 | Presence | 6.6 | 1.2 | 7.2 | 6.3 | 8.4 | 2.0 | 4.0 | 2.6 | 4.2 |
| 1-1 | Presence | 6.5 | 1.2 | 7.1 | 6.3 | 8.5 | 9.7 | 2.6 | 2.6 | 3.0 |
| 1-2 | Presence | 6.7 | 1.1 | 7.1 | 6.3 | 8.5 | 9.7 | 2.0 | 2.0 | 3.8 |
| 1-3 | Absence | — | — | — | — | — | 9.5 | 20.1 | 20.1 | 2.4 |
| 1-4 | Absence | — | — | — | — | — | 2 | — | 9.9 | 2.3 |
| 1-5 | Absence | — | — | — | — | — | 9.5 | 20.2 | 20.1 | 2.5 |
| 1-6 | Absence | — | — | — | — | — | 1.2 | — | 9.9 | 2.4 |
| 1-7 | Presence | 6.4 | 1.1 | 7.2 | 6.2 | 8.7 | 1 | 2.5 | 2.5 | 2.8 |

TABLE 8

| Sample No. | Substrate | Configuration of coating film | | | | | Heat treatment |
|---|---|---|---|---|---|---|---|
| | | TiN layer (Foundation layer) (μm) | TiCN layer (First intermediate layer) (μm) | TiSiCN layer (First layer) (μm) | TiCNO layer (Second intermediate layer) (μm) | Al₂O₃ layer (Surface layer) (μm) | |
| 21 | C | 1.1 | 1.9 | B(15) | — | — | C1 |
| 22 | C | 1.1 | 1.9 | B(15) | — | — | C2 |
| 23 | C | 1.1 | 1.9 | B(15) | — | — | C3 |
| 2-1 | C | 1.1 | 1.9 | B(15) | — | — | — |
| 2-2 | C | 1.5 | 2 | X(14.8) | — | — | — |
| 2-3 | C | — | — | Y(17.8) | — | — | — |

TABLE 9

| Sample No. | Lamellar structure | Hard grains Silicon high-concentration layer $\{X_{Si}/(X_{Si}+X_{Ti})\} \times 100$ (%) | Hard grains Silicon low-concentration layer $\{X_{Si}/(X_{Si}+X_{Ti})\} \times 100$ (%) | Lamellar period Average (nm) | Lamellar period Lower limit (nm) | Lamellar period Upper limit (nm) | Average aspect ratio | Grain boundary region $\{A_{Si}/(A_{Si}+A_{Ti})\} \times 100$ Maximum value (%) | First layer $\{B_{Si}/(B_{Si}+B_{Ti})\} \times 100$ Average value (%) | Cutting test Cutting distance (km) |
|---|---|---|---|---|---|---|---|---|---|---|
| 21 | Presence | 8.1 | 1.7 | 5.9 | 5.3 | 6.5 | 9.6 | 7.8 | 4.9 | 2.1 |
| 22 | Presence | 8.1 | 1.7 | 5.9 | 5.3 | 6.5 | 9.6 | 7.0 | 4.9 | 1.8 |
| 23 | Presence | 8.1 | 1.7 | 5.9 | 5.3 | 6.5 | 9.6 | 6.5 | 4.9 | 1.7 |
| 2-1 | Presence | 8.1 | 1.7 | 5.9 | 5.3 | 6.5 | 9.6 | 4.9 | 4.9 | 1.3 |
| 2-2 | Absence | — | — | — | — | — | 9.4 | 20.2 | 20.1 | 1.1 |
| 2-3 | Absence | — | — | — | — | — | 1.2 | — | 9.9 | 0.8 |

TABLE 10

| Sample No. | Substrate | Configuration of coating film TiN layer (Foundation layer) (μm) | TiCN layer (First intermediate layer) (μm) | TiSiCN layer (First layer) (μm) | TiCNO layer (Second intermediate layer) (μm) | Al$_2$O$_3$ layer (Surface layer) (μm) | Heat treatment |
|---|---|---|---|---|---|---|---|
| 31 | A | 1.1 | 1.8 | C(4.9) | — | — | C1 |
| 32 | A | 1.1 | 1.8 | C(4.9) | — | — | C2 |
| 33 | A | 1.1 | 1.8 | C(4.9) | — | — | C3 |
| 3-1 | A | 1.1 | 1.8 | C(4.9) | — | — | — |
| 3-2 | A | 1.1 | 2 | X(4.7) | — | — | — |
| 3-3 | A | — | — | Y(7.5) | — | — | — |

TABLE 11

| Sample No. | Lamellar structure | Hard grains Silicon high-concentration layer $\{X_{Si}/(X_{Si}+X_{Ti})\} \times 100$ (%) | Hard grains Silicon low-concentration layer $\{X_{Si}/(X_{Si}+X_{Ti})\} \times 100$ (%) | Lamellar period Average (nm) | Lamellar period Lower limit (nm) | Lamellar period Upper limit (nm) | Average aspect ratio | Grain boundary region $\{A_{Si}/(A_{Si}+A_{Ti})\} \times 100$ Maximum value (%) | First layer $\{B_{Si}/(B_{Si}+B_{Ti})\} \times 100$ Average value (%) | Cutting test Cutting distance (km) |
|---|---|---|---|---|---|---|---|---|---|---|
| 31 | Presence | 9.2 | 1.9 | 4.0 | 3.4 | 5.4 | 6.5 | 9.1 | 8.1 | 3.4 |
| 32 | Presence | 9.2 | 1.9 | 4.0 | 3.4 | 5.4 | 6.5 | 8.8 | 8.1 | 3.0 |
| 33 | Presence | 9.2 | 1.9 | 4.0 | 3.4 | 5.4 | 6.5 | 8.6 | 8.1 | 2.9 |
| 3-1 | Presence | 9.2 | 1.9 | 4.0 | 3.4 | 5.4 | 6.5 | 8.0 | 8.1 | 2.8 |
| 3-2 | Absence | — | — | — | — | — | 6.6 | 20.1 | 20.1 | 2.5 |
| 3-3 | Absence | — | — | — | — | — | 1.1 | — | 9.9 | 2.4 |

TABLE 12

| Sample No. | Substrate | Configuration of coating film TiN layer (Foundation layer) (μm) | TiCN layer (First intermediate layer) (μm) | TiSiCN layer (First layer) (μm) | TiCNO layer (Second intermediate layer) (μm) | Al$_2$O$_3$ layer (Surface layer) (μm) | Heat treatment |
|---|---|---|---|---|---|---|---|
| 41 | A | 1.1 | 1.9 | A(6.1) | — | — | C1 |
| 4-1 | A | 1.1 | 1.9 | A(6.1) | — | — | — |
| 4-2 | A | 1.1 | 1.9 | X(6.2) | — | — | — |
| 4-3 | A | — | — | Y(9.1) | — | — | — |

TABLE 13

| | | Hard grains | | | | | | Grain boundary region | First layer | |
|---|---|---|---|---|---|---|---|---|---|---|
| | | Silicon high-concentration layer | Silicon low-concentration layer | Lamellar period | | | | $\{A_{Si}/(A_{Si}+A_{Ti})\} \times 100$ | $\{B_{Si}/(B_{Si}+B_{Ti})\} \times 100$ | Oxidation test |
| Sample No. | Lamellar structure | $\{X_{Si}/(X_{Si}+X_{Ti})\} \times 100$ (%) | $\{X_{Si}/(X_{Si}+X_{Ti})\} \times 100$ (%) | Average (nm) | Lower limit (nm) | Upper limit (nm) | Average aspect ratio | Maximum value (%) | Average value (%) | Oxidation temperature |
| 41 | Presence | 6.5 | 1.2 | 7.1 | 6.3 | 8.5 | 7.7 | 4.1 | 2.5 | No oxidation |
| 4-1 | Presence | 6.5 | 1.2 | 7.1 | 6.3 | 8.5 | 7.7 | 2.5 | 2.5 | 1000° C. |
| 4-2 | Absence | — | — | — | — | — | 7.4 | 20.3 | 20.1 | 1000° C. |
| 4-3 | Absence | — | — | — | — | — | 1.2 | — | 10.1 | 850° C. |

TABLE 14

| | | Configuration of coating film | | | | | |
|---|---|---|---|---|---|---|---|
| Sample No. | Substrate | TiN layer (Foundation layer) (μm) | TiCN layer (First intermediate layer) (μm) | TiSiCN layer (First layer) (μm) | TiCNO layer (Second intermediate layer) (μm) | Al₂O₃ layer (Surface layer) (μm) | Heat treatment |
| 51 | D | 1.1 | 1.8 | D(3.1) | — | — | C1 |
| 5-1 | D | 1.1 | 1.8 | D(3.1) | — | — | — |
| 5-2 | D | 1.1 | 2 | X(3.2) | — | — | — |
| 5-3 | D | — | — | Y(6.2) | — | — | — |

TABLE 15

| | | Hard grains | | | | | | Grain boundary region | First layer | |
|---|---|---|---|---|---|---|---|---|---|---|
| | | Silicon high-concentration layer | Silicon low-concentration layer | Lamellar period | | | | $\{A_{Si}/(A_{Si}+A_{Ti})\} \times 100$ | $\{B_{Si}/(B_{Si}+B_{Ti})\} \times 100$ | Cutting test |
| Sample No. | Lamellar structure | $\{X_{Si}/(X_{Si}+X_{Ti})\} \times 100$ (%) | $\{X_{Si}/(X_{Si}+X_{Ti})\} \times 100$ (%) | Average (nm) | Lower limit (nm) | Upper limit (nm) | Average aspect ratio | Maximum value (%) | Average value (%) | Cutting distance (km) |
| 51 | Presence | 1.5 | 0.2 | 3.0 | 2.8 | 3.7 | 6.4 | 1.1 | 0.6 | 1.5 |
| 5-1 | Presence | 1.5 | 0.2 | 3.0 | 2.8 | 3.7 | 6.4 | 0.6 | 0.6 | 1.3 |
| 5-2 | Absence | — | — | — | — | — | 6.3 | 20.3 | 20.1 | 1.1 |
| 5-3 | Absence | — | — | — | — | — | 1.1 | — | 9.9 | 0.8 |

<Cutting Test 1>

Cutting was performed in the following cutting conditions by use of each of the cutting tools of Sample 1 to Sample 6 (Examples) and Sample 1-1 to 1-7 (Comparative Examples), and the cutting distance until the blade edge of the tool was in a defect state was measured. The following cutting conditions are for turning of general steel, and the turning corresponds to high-efficiency processing. It is indicated that, as the cutting distance is longer, the tool life is longer. The results are shown in the "Cutting distance (km)" column of "Cutting test" in Table 7.

<Cutting Conditions>

Wotkpiece material: SUJ2 (shape: rod material 4260 mm×1000 mm)
Holder: DCLNR2525M12
Insert: CMNG120408N-GU
Cutting velocity Vc: 300 m/min
Cutting depth ap: 1.5 mm
Amount f of sending: 0.3 mm
Cutting liquid: Presence (Wet)

<Consideration>

The cutting tools of Sample 1 to Sample 6 correspond to Examples, and the cutting tools of Sample 1-1 to Sample 1-7 correspond to Comparative Examples. It was confirmed that the cutting tools of Sample 1 to Sample 6 each had a longer tool life in high-efficiency processing than the cutting tools of Sample 1-1 to Sample 1-7. The reason for this is presumed because the hard grains have a lamellar structure and thus the coating film is enhanced in thermal crack propagation resistance and peeling resistance, and furthermore silicon concentration is increased in the grain boundary region to thereby suppress oxidation of the hard grains and/or the substrate and enhance wear resistance.

<Cutting Test 2>

Cutting was performed in the following cutting conditions by use of each of the cutting tools of Sample 21 to Sample 23 (Examples) and Sample 2-1 to Sample 2-3 (Comparative Examples), and the cutting distance until the blade edge of the tool was in a defect state was measured. The following cutting conditions are for turning of cast iron, and the turning corresponds to high-efficiency processing. It is indicated that, as the cutting distance is longer, the tool life is longer. The results are shown in the "Cutting distance (km)" column of "Cutting test" in Table 9.

<Cutting Conditions>

Workpiece material: FCD700 (shape: rod material φ260 mm×1000 mm)
Holder. DCLNR2525M12
Insert. CMNG120408N-GZ
Cutting velocity Vc: 140 m/min
Cutting depth ap: 1.5 mm
Amount f of sending: 0.3 mm
Cutting liquid: Presence (Wet)

<Consideration>

It was confirmed that Sample 21 to Sample 23 (Examples) each had a long cutting distance in turning of cast iron and a long tool life in high-efficiency processing, as compared with Sample 2-1 to Sample 2-3 (Comparative Examples) The reason for this is presumed because, in Sample 21 to Sample 23, the silicon concentration is increased in the grain boundary region to (hereby suppress oxidation of the hard grains and/or the substrate and enhance wear resistance.

<Cutting Test 3>

Cutting was performed in the following cutting conditions by use of each of the cutting tools of Sample 31 to Sample 33 (Examples) and Sample 3-1 to Sample 3-3 (Comparative Examples), and the cutting distance until the blade edge of the tool was in a defect state was measured. The following cutting conditions are for milling of general steel, and the milling corresponds to high-efficiency processing. It is indicated that, as the cutting distance is longer, the tool life is longer. The results are shown in the "Cutting distance (km)" column of "Cutting test" in Table 11.

<Cutting Conditions>

Workpiece material: S50C blocking material
Cutter: DFC09100RS (manufactured by Sumitomo Electric Industries, Ltd.)
Insert: XNMU060608PNER-G
Cutting velocity Vc: 200 m/min
Amount fz of sending per blade: 0.2 mm/t
Cutting depth ap: 3.0 mm
Cutting width ae: 85 mm
Cutting liquid: Absence (Dry)

<Consideration>

It was confirmed that Sample 31 to Sample 33 (Examples) each had a long cutting distance in milling of general steel and a long tool life in high-efficiency processing, as compared with Sample 3-1 to Sample 3-3 (Comparative Examples). The reason for this is presumed because, in Sample 31 to Sample 33, the silicon concentration is increased in the grain boundary region to thereby suppress oxidation of the hard grains and/or the substrate and enhance wear resistance.

<Oxidation Resistance Test>

An oxidation resistance test was performed by use of each of the cutting tools of Sample 41 (Example) and Sample 4-1 to Sample 4-3 (Comparative Examples). The oxidation resistance test was performed by the following procedure A plurality of samples were provided for each Sample. For example. Sample A was heated to a temperature of 700° C. in the air and then held at the temperature for 60 minutes, and thereafter gradually cooled to room temperature. Sample B was heated to a temperature of 750° C. in the air and then held at the temperature for 60 minutes, and thereafter gradually cooled to room temperature. Sample C was heated to a temperature of 800° C. in the air and then held at the temperature for 60 minutes, and thereafter gradually cooled to room temperature. The heating temperature was thus changed by 50° C. with respect to every Sample.

The appearance of each Sample after gradual cooling was visually observed, and a case where exposure of a mother material and deformation of the substrate by peeling of the coating film were caused was determined as oxidation of the coating film. If no deformation of the substrate was confirmed by visual observation of the appearance of each Sample, each Sample was cut, and a case where the coating film remained in SEM observation and elemental analysis of the cross section of the substrate was determined as no oxidation. The lowest temperature at which the oxidation state was confirmed was defined as the oxidation temperature.

It is indicated that, as the oxidation temperature is higher, oxidation resistance is more excellent. The results are shown in the "Oxidation temperature" column of "Oxidation test" in Table 13.

<Consideration>

It was confirmed that Sample 41 (Example) was not oxidized even if heated to 1000° C. The reason for this is presumed because, in Sample 41, silicon (Si) at the grain boundary inhibits oxygen (O) from diffusing along with the grain boundary and oxidation resistance is enhanced.

<Cutting Test 4>

Cutting was performed in the following cutting conditions by use of each of the cutting tools of Sample 51 (Example) and Sample 5-1 to Sample 5-3 (Comparative Examples), and the cutting distance until the blade edge of the tool was in a defect state was measured. The following cutting conditions are for milling of general steel, and the milling corresponds to high-efficiency processing. It is indicated that, as the cutting distance is longer, the tool life is longer. The results are shown in the "Cutting distance (km)" column of "Cutting test" in Table 15.

<Cutting Conditions>

Workpiece material: SCM435 fraise (85 mm×100 mm×300 mm)
Cutter: WGC4160R (manufactured by Sumitomo Electric Industries, Ltd.)
Insert: SEET13T3AGSN-G
Cutting velocity Vc: 350 m/min
Amount fz of sending per blade: 0.2 mm/t
Cutting depth ap: 2.0 mm
Cutting width ae: 85 mm
Cutting liquid: Absence (Dry)

<Consideration>

It was confirmed that Sample 51 (Example) had a long cutting distance in milling of general steel and a long tool life in high-efficiency processing, as compared with Sample 5-1 to Sample 5-2 (Comparative Examples). The reason for this is presumed because, in Sample 51, the silicon concentration is increased in the grain boundary region to thereby suppress oxidation of the hard grains and/or the substrate and enhance wear resistance.

While embodiments and Examples of the present disclosure are described as above, configurations of the above embodiments and Examples are initially expected to be appropriately combined or variously modified.

It should be considered that embodiments and Examples disclosed here are illustrative in all points and are not limitative. The scope of the present invention is shown by not the above embodiments and Examples, but claims, and is intended to include all modifications falling within the meanings and scopes equivalent to claims.

REFERENCE SIGNS LIST

1 cutting tool, 10 substrate, 11 first layer, 12 foundation layer, 13 surface layer, 14 first intermediate layer, 15 coating film, 16 second intermediate layer, 21 layer having a relatively high silicon concentration (silicon high-concentration layer), 22 layer having a relatively low silicon concentration (silicon low-concentration layer), 23A, 23B hard grain, 24 grain boundary region, 50 CVD apparatus, 52 substrate setting jig, 53 reaction vessel, 54 temperature control apparatus, 55, 57 introduction port, 56 nozzle, 59 exhaust pipe, 60 exhaust port, 61 first spray hole, 62 second spray hole

The invention claimed is:

1. A cutting tool comprising a substrate and a coating film disposed on the substrate, wherein
the coating film comprises a first layer formed from a plurality of hard grains,
the hard grains are made of TiSiCN having a cubic crystal structure,
the hard grains have a lamellar structure in which a layer having a first silicon concentration and a layer having a second silicon concentration, lower than the first silicon concentration, are alternately stacked,
the first silicon concentration corresponds to a number $A_{Si}$ of silicon atoms divided by a sum of a) a number $A_{Si}$ of silicon atoms and b) a number $A_{Ti}$ of titanium atoms in a grain boundary region between the hard grains, $\{A_{Si}/(A_{Si}+A_{Ti})\}$,
the second silicon concentration corresponds to a number $B_{Si}$ of silicon atoms divided by a sum of c) a number $B_{Si}$ of silicon atoms and d) a number $B_{Ti}$ of titanium atoms in the first layer, $\{B_{Si}/(B_{Si}+B_{Ti})\}$, and
a maximum value of $A_{Si}/(A_{Si}+A_{Ti})$ is greater than an average value of $B_{Si}/(B_{Si}+B_{Ti})$.

2. The cutting tool according to claim 1, wherein a difference between the maximum value of $\{A_{Si}/(A_{Si}+A_{Ti})\}$ and the average value of $\{B_{Si}/(B_{Si}+B_{Ti})\}$ is 0.005 or more.

3. The cutting tool according to claim 1, wherein the average value of $\{B_{Si}/(B_{Si}+B_{Ti})\}$ is 0.005 or more and 1.0 or less.

4. The cutting tool according to claim 1, wherein
the first layer has a thickness of 3 μm or more and 15 μm or less, and
the coating film has a thickness of 3 μm or more and 30 μm or less.

5. The cutting tool according to claim 1, wherein
the maximum value of the first silicon concentration is measured by subjecting the grain boundary region in a cross section along a normal line of a surface of the coating film, to line analysis at a length of 60 nm or more in a direction perpendicular to an extension direction of the grain boundary region, by use of STEM-EDX, and
the average value of the second silicon concentration is measured by subjecting a rectangular measurement field of view of 100 nm×100 nm provided in the first layer in the cross section, to rectangular analysis by use of STEM-EDX.

6. The cutting tool according to claim 1, wherein the hard grains have an average aspect ratio of 2 or more.

7. A method for manufacturing the cutting tool according to claim 1, comprising:
step 1 of providing a substrate,
step 2 of forming a coating film on the substrate, and
step 3 of subjecting the coating film to a heat treatment to obtain a cutting tool, wherein
the coating film formed in step 2 comprises a first layer formed from a plurality of hard grains,
the hard grains are made of TiSiCN having a cubic crystal structure, and
the hard grains have a lamellar structure in which a layer having a first silicon concentration and a layer having a second silicon concentration lower than the first silicon concentration, are alternately stacked.

8. The method for manufacturing the cutting tool according to claim 7, wherein the heat treatment in step 3 comprises heating the coating film at 1050° C. or more and 1100° C. or less in a hydrogen atmosphere at a pressure of 850 hPa or more and 950 hPa or less for 5 minutes or more and 30 minutes or less.

9. The method for manufacturing the cutting tool according to claim 7, wherein
step 2 comprises step 2a of forming the first layer by a CVD method with a CVD apparatus,
step 2a comprises step 2a-1 of spraying a $TiCl_4$ gas, a $SiCl_4$ gas and a $CH_3CN$ gas toward a surface of the substrate,
the $TiCl_4$ gas is sprayed through a plurality of first spray holes provided on a nozzle of the CVD apparatus,
the $SiCl_4$ gas is sprayed through a plurality of second spray holes provided on the nozzle,
the $CH_3CN$ gas is sprayed through a plurality of third spray holes provided on the nozzle,
the nozzle is rotated in step 2a-1,
the plurality of second spray holes include a second-first spray hole and a second-second spray hole, and
a diameter r1 of the second-first spray hole is different from a diameter r2 of the second-second spray hole.

* * * * *